US011835580B2

(12) United States Patent
Nayak et al.

(10) Patent No.: US 11,835,580 B2
(45) Date of Patent: Dec. 5, 2023

(54) CIRCUIT AND METHOD TO MEASURE SIMULATION TO SILICON TIMING CORRELATION

(71) Applicant: MEDIATEK Singapore Pte. Ltd., Singapore (SG)

(72) Inventors: Ashish Kumar Nayak, San Jose, CA (US); Hugh Thomas Mair, San Jose, CA (US); Anshul Varma, San Jose, CA (US); Anand Rajagopalan, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/397,879

(22) Filed: Aug. 9, 2021

(65) Prior Publication Data

US 2022/0170986 A1 Jun. 2, 2022

Related U.S. Application Data

(60) Provisional application No. 63/119,672, filed on Dec. 1, 2020.

(51) Int. Cl.
*H03K 3/03* (2006.01)
*G01R 31/3193* (2006.01)
(Continued)

(52) U.S. Cl.
CPC ... *G01R 31/31725* (2013.01); *G01R 31/3016* (2013.01); *G01R 31/31937* (2013.01); *H03K 3/0315* (2013.01); *H03K 5/134* (2014.07)

(58) Field of Classification Search
CPC G01R 29/023; G01R 29/027; G01R 29/0273; G01R 31/2882; G01R 31/3016;
(Continued)

(56) References Cited

U.S. PATENT DOCUMENTS 5,204,559 A * 4/1993 Deyhimy ............ H03K 5/1502 327/250
5,815,043 A * 9/1998 Chow .................. H03K 3/0315 331/108 C (Continued)

*Primary Examiner* — Levi Gannon
(74) *Attorney, Agent, or Firm* — Wolf, Greenfield & Sacks, P.C.

(57) ABSTRACT

Described herein are improved techniques for measuring propagation delay of an integrated circuit that facilitate performing propagation delay measurements on-chip. Some embodiments relate to an integrated circuit comprising programmable oscillator circuitry with a plurality of oscillator stages that are switchable into and out of a delay path based on control signals from a controller, allowing the same programmable oscillator to generate many different oscillator signals according to the received control signals, for the controller to determine a central tendency and/or variance of propagation delay of the integrated circuit. Some embodiments relate to an integrated circuit including programmable delay paths configured to provide an amount of cell delay and an amount of wire delay based on control signals from a controller, allowing the same programmable delay path to generate signals for measuring delays due to cell and wire delays of the integrated circuit.

9 Claims, 12 Drawing Sheets

(51) Int. Cl.
*H03K 5/134* (2014.01)
*G01R 31/317* (2006.01)
*G01R 31/30* (2006.01)

(58) Field of Classification Search
CPC ........ G01R 31/31725; G01R 31/31937; H03K 3/0315; H03K 3/0322; H03K 5/131; H03K 5/133; H03K 5/134
USPC ........................................................... 331/57
See application file for complete search history.

(56) References Cited

U.S. PATENT DOCUMENTS 5,847,617 A * 12/1998 Reddy .................. H03K 3/0315 331/34
7,184,936 B1 2/2007 Bhandari
7,705,687 B1 * 4/2010 Paz ....................... H03L 7/0997 327/161
8,315,830 B2 11/2012 Martin et al.
8,816,778 B2 * 8/2014 Bracmard ................. G06F 1/08 331/2
9,664,737 B2 5/2017 Tee et al.
2002/0008591 A1 1/2002 Swoboda
2005/0248415 A1 * 11/2005 Osvaldella ............. H03K 5/133 331/57
2009/0002081 A1 * 1/2009 Kim ......................... H03K 3/03 331/44
2010/0164583 A1 * 7/2010 Chen .................... H03K 3/0315 327/261
2010/0327982 A1 * 12/2010 Dixit ........................ H03K 3/02 327/295
2012/0128110 A1 5/2012 Krönke et al.
2015/0097608 A1 * 4/2015 Tiwari ................... H03K 5/131 327/269

* cited by examiner

CIRCUIT AND METHOD TO MEASURE SIMULATION TO SILICON TIMING CORRELATION

CROSS-REFERENCE TO RELATED APPLICATIONS

This application claims priority to U.S. Provisional Patent Application Ser. No. 63/119,672, titled "CIRCUIT AND METHOD TO MEASURE SIMULATION TO SILICON TIMING CORRELATION," filed Dec. 1, 2020, which is hereby incorporated by reference in its entirety.

BACKGROUND

Integrated circuits can include digital logic circuits such as arrangement of digital logic gates that output digital signals (e.g., combinations of high and low voltage bits) based on digital signals received at or generated by the integrated circuit. The digital logic gates are typically formed using transistors fabricated on the integrated circuit.

Physical parameters of the transistors on the integrated circuit typically limit how quickly a digital signal can propagate from one digital logic gate to the next digital logic gate. For example, transistors switch on or off once a gate voltage of the transistor reaches a threshold voltage, and transistors usually have some gate capacitance that takes some time to charge up to the voltage of a signal received at the gate. The time it takes for a signal to travel from the input to the output of a set of one or more logic gates is the propagation delay of the set of logic gates.

Computer simulation tools, such as static timing analysis (STA) tools, can estimate the propagation delays of digital logic gates prior to fabrication using propagation delay measurements of previously fabricated integrated circuits.

BRIEF SUMMARY

Some embodiments relate to an integrated circuit comprising programmable circuitry configured to generate a first oscillator signal in response to a first plurality of control signals and a second oscillator signal in response to a second plurality of control signals and a controller configured to provide the first and second pluralities of control signals to the programmable circuitry, receive the first and second oscillator signals, and determine a central tendency of propagation delay of the programmable circuitry using the first and second oscillator signals.

In some embodiments, the controller may be configured to determine first and second pulse widths of the first and second oscillator signals, respectively, and determine the central tendency of propagation delay of the programmable circuitry using the first and second pulse widths.

In some embodiments, the controller may be configured to subtract one of the first and second pulse widths from the other of the first and second pulse widths to generate a third pulse width and determine the central tendency of propagation delay using the third pulse width and the other of the first and second pulse widths.

In some embodiments, the controller may be further configured to determine sampling parameters for determining the central tendency of propagation delay using the first and/or second oscillator signals.

In some embodiments, the central tendency of propagation delay may be a mean propagation delay of the programmable circuitry, and the controller may be further configured to determine a variance of propagation delay of the programmable circuitry.

In some embodiments, the programmable circuitry may comprise a programmable ring oscillator that has a plurality of selectable oscillator stages and is configured to select a first subset of the plurality of selectable oscillator stages based on the first plurality of control signals to generate the first oscillator signal and select a second subset of the plurality of selectable oscillator stages based on the second plurality of control signals to generate the second oscillator signal.

In some embodiments, the programmable circuitry may further comprise a second programmable ring oscillator that has a second plurality of selectable oscillator stages and is configured to select a first subset of the second plurality of selectable oscillator stages based on the first plurality of control signals to generate a third oscillator signal and select a second subset of the second plurality of selectable oscillator stages based on the second plurality of control signals to generate a fourth oscillator signal. In some embodiments, the programmable ring oscillator may comprise a first plurality of transistors and the second programmable ring oscillator may comprise a second plurality of transistors having different control terminal threshold voltages than the first plurality of transistors. In some embodiments, the controller may be further configured to receive the third and fourth oscillator signals and determine a central tendency of propagation delay of the second programmable ring oscillator using the third and fourth oscillator signals.

Some embodiments relate to an integrated circuit, comprising a programmable ring oscillator comprising a delay path, the programmable ring oscillator being configured to propagate an oscillator signal along the delay path, the delay path comprising a plurality of oscillator stages, oscillator stages of the plurality of oscillator stages being switchable into and out of the delay path based on a plurality of respective control signals.

In some embodiments, the plurality of oscillator stages may comprise a first oscillator stage configured to receive a first control signal of the plurality of control signals, and wherein the programmable ring oscillator is configured to propagate the oscillator signal through the first oscillator stage when the first control signal has a first state and bypass the first oscillator stage with the oscillator signal when the first control signal has a second state.

In some embodiments, the integrated circuit may further comprise a controller configured to provide the plurality of control signals to the programmable ring oscillator, obtain the oscillator signal from the programmable ring oscillator, and determine a pulse width of the oscillator signal.

In some embodiments, the controller may be configured to thermometer-encode the plurality of control signals.

In some embodiments, the controller may be configured to provide a first plurality of control signals to the programmable ring oscillator, obtain a first oscillator signal from the programmable ring oscillator, the first oscillator signal being propagated along the delay path of the programmable ring oscillator in response to receiving the first plurality of control signals, provide a second plurality of control signals to the programmable ring oscillator that is different from the first plurality of control signals, obtain a second oscillator signal from the programmable ring oscillator, the second oscillator signal being propagated along the delay path of the programmable ring oscillator in response to receiving the second plurality of control signals, and determine a central tendency of pulse widths of at least the first and second oscillator signals.

In some embodiments, the integrated circuit may further comprise a second programmable ring oscillator comprising a second delay path, the second programmable ring oscillator being configured to propagate a second oscillator signal along the second delay path, and the second delay path may comprise a second plurality of oscillator stages, oscillator stages of the second plurality of oscillator stages being switchable into and out of the second delay path based on a second plurality of respective control signals. In some embodiments, the programmable ring oscillator may comprise a first plurality of transistors, the second programmable ring oscillators comprise a second plurality of transistors, and the first plurality of transistors having different control terminal voltage thresholds than the second plurality of transistors.

In some embodiments, the integrated circuit may further comprise a controller configured to provide the plurality of control signals to the programmable ring oscillator and the second plurality of control signals to the second programmable ring oscillator, receive the oscillator signal from the programmable ring oscillator and the second oscillator signal from the second programmable ring oscillator, and determine pulse widths of the oscillator signal and the second oscillator signal.

Some embodiments relate to an integrated circuit comprising a programmable delay path comprising a plurality of path delay tuners configured to receive a plurality of control signals and add to the programmable delay path an amount of cell delay and an amount of wire delay that are based on the plurality of control signals, and a controller configured to provide the plurality of control signals to the programmable delay path, receive a signal from the programmable delay path, and compare the signal to a reference signal.

In some embodiments, the controller may be configured to determine whether a delay of the programmable delay path exceeds a threshold delay based on comparing the signal to the reference signal.

In some embodiments, the plurality of path delay tuners may comprise a first path delay tuner configured to receive a first control signal of the plurality of control signals, select a first amount of cell delay and a first amount of wire delay to add to the programmable delay path when the first control signal has a first state, and select a second amount of wire delay and a second amount of cell delay to the programmable delay path when the first control signal has a second state.

In some embodiments, the first path delay tuner may comprise a first selectable sub-path comprising a first number of logic gates and a second selectable sub-path comprising a second number of logic gates that is different from the first number of logic gates, and the first path delay tuner may be configured to select the first selectable sub-path when the first control signal has the first state and select the second selectable sub-path when the first control signal has the second state.

In some embodiments, the first path delay tuner may further comprise a third selectable sub-path having the first number of logic gates and a fourth selectable sub-path having the second number of logic gates, the first and second selectable sub-paths comprising a first plurality of transistors and the third and fourth selectable sub-paths comprising a second plurality of transistors, the second plurality of transistors having different control terminal voltage thresholds than the first plurality of transistors, and the first path delay tuner may be further configured to receive a second control signal of the plurality of control signals, select the first and second selectable sub-paths when the second control signal has a first state, and select the third and fourth selectable sub-paths when the second control signal has a second state.

In some embodiments, the integrated circuit may further comprise a second programmable delay path comprising a second plurality of path delay tuners configured to receive a second plurality of control signals and add to the second programmable delay path an amount of cell delay and an amount of wire delay that are based on the second plurality of control signals. In some embodiments, the controller may be further configured to provide the second plurality of control signals to the second programmable delay path, receive a second signal from the programmable delay path, and compare the second signal to a second reference signal. In some embodiments, the programmable delay path may comprise a first plurality of transistors and the second programmable delay path may comprise a second plurality of transistors having different channel widths than the first plurality of transistors.

Some embodiments relate to an integrated circuit comprising at least one circuit selected from the group consisting of a first circuit and a second circuit. In some embodiments, the first circuit may comprise a programmable ring oscillator comprising a first programmable delay path, the programmable ring oscillator being configured to propagate an oscillator signal along the first programmable delay path, the first programmable delay path comprising a plurality of oscillator stages, oscillator stages of the plurality of oscillator stages being switchable into and out of the first programmable delay path based on a first plurality of respective control signals. In some embodiments, the second circuit may comprise a programmable second delay path comprising a plurality of path delay tuners configured to receive a second plurality of control signals and add to the programmable second delay path an amount of cell delay and an amount of wire delay that are based on the second plurality of control signals, and a controller configured to provide the second plurality of control signals to the programmable delay path, receive a signal from the second programmable delay path, and compare the signal to a reference signal.

The foregoing summary is provided by way of illustration and is not intended to be limiting

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
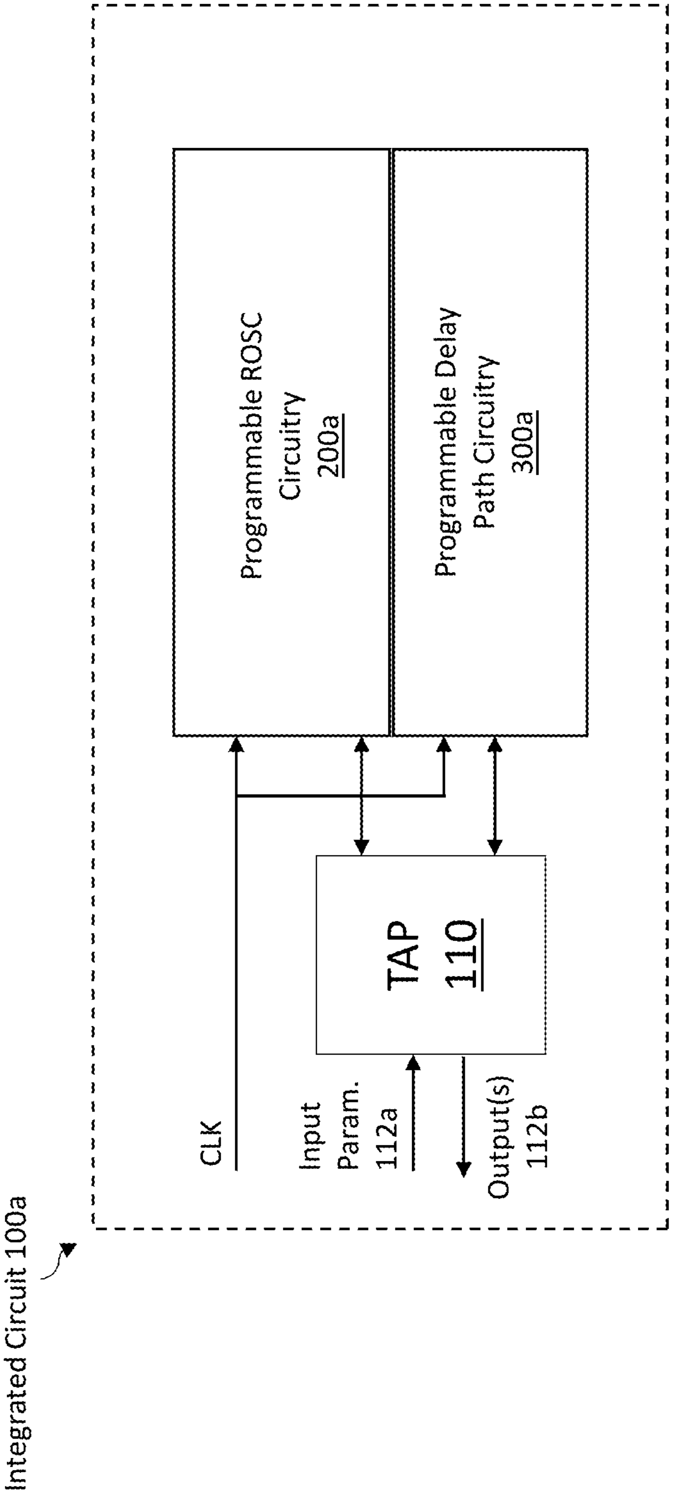
FIG. 1 is a block diagram illustrating an exemplary integrated circuit that includes programmable ring oscillator (ROSC) circuitry and programmable delay path circuitry, in accordance with some embodiments.

The inventors recognized several drawbacks of previous techniques for measuring propagation delays of an integrated circuit. One such drawback is that propagation delay test structures have not been implemented on-chip in a cost-effective way. For instance, previous test structures rely on using a multitude of different structures on the integrated circuit to produce enough delay data to conduct accurate measurements. For example, in some applications, measuring a mean propagation delay of an integrated circuit can require delay measurements from hundreds of different logic gate configurations, which, according to previous techniques, could require hundreds of differently configured test structures to generate the requisite number of measurements. Similarly, measuring a variance in propagation delay of an integrated circuit could require even more test structures than for mean measurements. The inventors recognized that variance measurements are particularly useful to incorporate during simulation for estimating post-fabrication performance, as the variance in propagation delay in integrated circuits is increasing as integrated circuits are made to include denser logic gate configurations.

In some applications, even more dedicated test structures may be required to measure different types of propagation delay in the integrated circuit, such as cell delay due to propagation via logic gates, wire delay due to propagation via wires between logic gates, and delays due to voltage thresholds of the transistors. By relying on a multitude of different structures to obtain useful propagation delay measurements, test structures according to previous techniques take up a large amount of space on-chip, making them expensive to implement and unsuitable for obtaining various different types of propagation delay measurements.

Another drawback is that measurement circuits for measuring propagation delays from on-chip test structures are implemented outside of the integrated circuit, which increases the complexity of transmitting signals off of the chip for measurement. As discussed above, test structures can be large and take up expensive space on-chip, which precludes inclusion of measurement circuits on-chip to measure propagation delays generated by the test structures. Since the measurement circuits are implemented off-chip, signals generated by the test structures have to be extracted for off-chip measurement, which can require large test pads to be placed on the integrated circuit for reading off the generated signals via bond wires. For instance, since propagation delays on an integrated circuit are typically on the order of picoseconds or shorter, the signals generated by the integrated circuit are unsuitable for use with standard input/output (I/O) interface standards such as Joint Test Action Group (JTAG) interface standards. The large test pads used to read signals off of the integrated circuit for measurement also increase the cost of implementation due to taking up a large amount of space on-chip.

To overcome the above drawbacks of previous techniques, the inventors developed improved techniques for measuring propagation delay of an integrated circuit that facilitate performing propagation delay measurements on-chip. In some embodiments, an integrated circuit described herein may include programmable circuitry and a controller configured to provide control signals to the programmable circuitry to generate signals for measuring propagation delays of the integrated circuit. For example, in some embodiments, the programmable circuitry may include a programmable oscillator with a plurality of oscillator stages that are switchable into and out of a delay path based on control signals from the controller. In this example, switching oscillator stages in and out of the delay path using control signals from the controller can allow the same programmable oscillator to generate many different oscillator signals, (e.g., using different combinations of oscillator stages), according to the received control signals. In some embodiments, the controller may be configured to determine a central tendency and/or variance of propagation delay of the integrated circuit, such as using signals generated using different combinations of oscillator stages of a programmable oscillator. Moreover, in some embodiments, programmable circuitry described herein can include a plurality of oscillators, each having transistors with different voltage thresholds, facilitating measurements of propagation delay for the different voltage thresholds.

In some embodiments, programmable circuitry of an integrated circuit can include a plurality of programmable delay paths, which can be configured to provide an amount of cell delay and an amount of wire delay based on control signals from a controller. For example, each programmable delay path can include path tuners configured to add different amounts of cell and wire delay to the delay path based on the control signals. In this example, adding cell and wire delays based on the control signals can allow the same programmable delay path to generate signals for measuring delays due to cell and wire delays of the integrated circuit (e.g., using different tuner configurations). In some embodiments, each programmable delay path can have transistors with different channel widths, facilitating measurements of propagation delay for the different channel widths.

Accordingly, programmable circuitry and controllers described herein can generate a large enough amount of propagation delay measurements, and/or measurements taking into account various different types of propagation delays, using programmable structures that take up less space on-chip than previously employed fixed test structures. By consuming less space on-chip, programmable circuitry described herein is cost-effective to implement in an integrated circuit. In addition, by including the controller in the integrated circuit, the controller can be configured to perform measurements on the integrated circuit and offload data from the chip using a standard interface.

It should be appreciated that techniques described herein can be used alone or in combination.

FIG. 1 is a block diagram illustrating an exemplary integrated circuit 100*a* that includes programmable ring oscillator (ROSC) circuitry 200*a* and programmable delay path circuitry 300*a*, in accordance with some embodiments. As shown in FIG. 1, integrated circuit 100*a* also includes a test access port (TAP) 110 configured to receive input parameters 112*a* from outside of the integrated circuit 100*a* and transmit one or more outputs 112*b* outside the integrated circuit 100*a*. Also shown in FIG. 1, integrated circuit 100*a* may be configured to receive a clock (CLK) signal and provide the CLK signal to programmable ROSC circuitry 200*a* and/or programmable delay path circuitry 300*a*. In some embodiments, integrated circuit 100*a* may include an array of digital logic gates. For example, integrated circuit 100*a* may be a field programmable gate array (FPGA). Alternatively, integrated circuit 100*a* may be an application-specific integrated circuit (ASIC).

In some embodiments, programmable ROSC circuitry 200*a* and/or programmable delay path circuitry 300*a* may include groups of logic gates formed on integrated circuit 100*a*. In some embodiments, programmable ROSC circuitry 200*a* may be configured to measure propagation delays in the integrated circuit 100*a*. For example, in some embodiments, programmable ROSC circuitry 200*a* may be configured to generate and measure oscillator signals that indicate propagation delays of programmable ROSC circuitry 200*a*. In some embodiments, programmable ROSC circuitry 200*a* may be configured to determine a central tendency and/or variance of propagation delay of programmable ROSC circuitry 200*a*. In some embodiments, programmable delay path circuitry 300*a* may be configured to measure and compare propagation delays of various types in the integrated circuit 100*a* to a threshold delay amount. For example, in some embodiments, programmable delay path circuitry 300*a* may be configured to propagate signals along a programmable delay path having configurable amounts of cell delay and/or wire delay and compare the propagated signals to reference signals to determine whether delays in the programmable delay path exceed a threshold delay amount. In some embodiments, programmable delay path circuitry 300*a* may be configured to control an amount of cell delay and/or an amount of wire delay of the programmable delay path.

As described further herein, in some embodiments, programmable ROSC circuitry 200*a* and/or programmable delay path circuitry 300*a* may be programmed to operate according to control signals received via TAP 110. In some embodiments, TAP 110 may be configured to transmit to programmable ROSC circuitry 200*a* ones of the input parameters 112*a* that are configured to control operation of programmable ROSC circuitry 200*a* and transmit to programmable delay path circuitry 300*a* ones of the input parameters 112*a* that are configured to control operation of programmable delay path circuitry 300*a*. For example, input parameters 112*a* configured to control operation of programmable ROSC circuitry 200*a* may include parameters that control generation of oscillator signals and/or measurement of the oscillator signals, and input parameters 112*a* configured to control operation of programmable delay path circuitry 300*a* may include parameters that control delays in the programmable delay path. In some embodiments, TAP 100 may be configured to receive output signals 112*b* from programmable ROSC circuitry 200*a* and programmable delay path circuitry 300*a* for transmission outside of integrated circuit 100*a*. For example, output signals 112*b* may indicate propagation delays measured by programmable ROSC circuitry 200*a* and/or whether delay in signals propagated by programmable delay path circuitry exceed a threshold delay amount.

In some embodiments, TAP 110 may be configured as a parallel and/or serial port interface controller configured to transmit and/or receive encoded signals over a parallel and/or serial communication medium, such as one or more cables and one or more electrical connectors, to another circuit outside of the integrated circuit 100*a*. For example, in some embodiments, TAP 110 may be compatible with a JTAG interface standard.

It should be appreciated that integrated circuit 100*a* may include any combination of field-programmable and pre-programmed digital logic circuitry. It should also be appreciated that, according to various embodiments, only programmable ROSC circuitry 200*a* (e.g., with or without TAP 110) may be included, or only programmable delay path circuitry 300*a* (e.g., with or without TAP 110) may be included.

Figure 2:
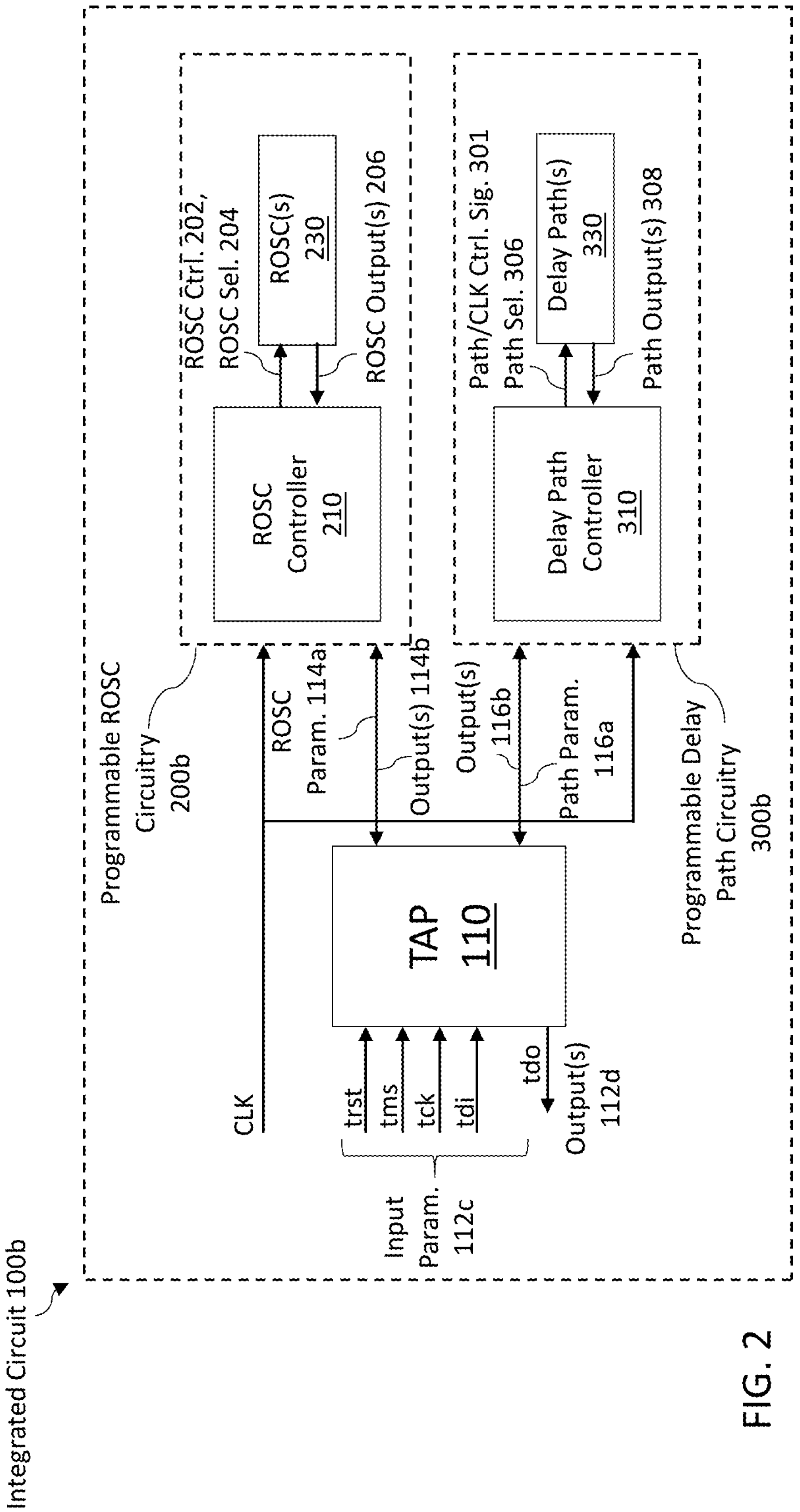
FIG. 2 is a block diagram illustrating an alternative exemplary integrated circuit including programmable ROSC circuitry and programmable delay path circuitry, in accordance with some embodiments.

FIG. 2 is a block diagram illustrating an alternative exemplary integrated circuit 100*b* including programmable ROSC circuitry 200*b* and programmable delay path circuitry 300*b*, in accordance with some embodiments. In some embodiments, integrated circuit 100*b* may be configured in the manner described herein for integrated circuit 100*a* in connection with FIG. 1. For example, in some embodiments, programmable ROSC circuitry 200*b* and programmable delay path circuitry 300*b* may be configured in the manner described herein for programmable ROSC circuitry 200*a* and programmable delay path circuitry 300*a* in connection with FIG. 1.

As shown in FIG. 2, TAP 110 may be configured to receive input parameters 112*c* from outside of integrated circuit 100*b*, transmit ROSC parameter signals 114*a* to programmable ROSC circuitry 200*b* and path parameters 116*a* to programmable delay path circuitry 300*b*, and transmit outputs 112*b* outside of integrated circuit 100*b*. For example, in FIG. 2, input parameters 112*c* include test reset (trst), test mode select (tms), test clock (tck), and test data in (tdi), and outputs 112*b* include test data out (tdo). For example, each of parameters trst, tms, tck, tdi, and tdo may have its own dedicated input/output (I/O) pin of integrated circuit 100*b*. In some embodiments, test data in tdi may include serial data transmitted according to test clock tck and including control parameters for programmable ROSC circuitry 200*b* and/or programmable delay path circuitry 300*b*. For example, the control parameters may be transmitted to programmable ROSC circuitry 200*b* as ROSC parameter signals 114*a* and/or to programmable delay path circuitry 300*b* as path parameters 116*a*. In some embodiments, test data out tdo may include serial data including outputs from programmable ROSC circuitry 200*b* and/or programmable delay path circuitry 300*b* that may be transmitted according to test clock tck. For example, the outputs may be received from programmable ROSC circuitry as output(s) 114*b* and/or from programmable delay path circuitry 300*b* as output(s) 116*b*.

As shown in FIG. 2, in some embodiments, programmable ROSC circuitry 200*b* may include a ROSC controller 210 and one or more ROSCs 230. In some embodiments, ROSC controller 210 may be configured to control operation of ROSC(s) 230 to generate output signals (e.g., oscillator signals), and ROSC controller 210 may be configured to measure propagation delays of ROSC(s) 230 based on the generated output signals. For example, as shown in FIG. 2, ROSC controller 210 may be configured to transmit one or more ROSC control signals 202 and one or more ROSC select signals 204 to ROSC(s) 230. In some embodiments, ROSC controller 210 may be configured to generate ROSC control signals 202 and ROSC select signals 204 based on ROSC parameter signals 114*a* received via TAP 110. In the illustrated example, ROSC(s) 230 may be configured to generate, select, and transmit one or more ROSC output signals 206 to ROSC controller 210 based on ROSC control signals 202 and ROSC select signals 204. In some embodiments, ROSC controller 210 may be configured to measure propagation delays of ROSC(s) 230 based on ROSC output signals 206. In some embodiments, ROSC controller 210 may be configured to determine a central tendency and/or variance of propagation delays of ROSC(s) 230. In some embodiments, ROSC controller 210 may be configured to transmit output(s) 114*b* to TAP 110, with output(s) 114*b* indicating propagation delays (e.g., central tendency and/or variance of propagation delays) of ROSC(s) 230.

As shown in FIG. 2, in some embodiments, programmable delay path circuitry 300*b* may include a delay path controller 310 and one or more delay paths 330. In some embodiments, delay path controller 310 may be configured to control operation of delay path(s) 330 to generate output signals, and delay path controller 310 may be configured to compare the received output signals to reference signals to determine whether propagation delays of the delay path(s) 330 exceed a threshold delay amount. For example, as shown in FIG. 2, delay path controller 310 may be configured to transmit one or more path and/or clock control signals 301 and one or more path select signals 306 to delay path(s) 330. In some embodiments, delay path controller 310 may be configured to generate path and/or clock control signals 301 and path select signals 306 based on path parameter signals 116*a* received via TAP 110. In some embodiments, delay path(s) 330 may be configured to generate, select, and transmit path output signals 308 to delay path controller 310 based on path and/or clock control signals 301 and path select signals 306. For example, in some embodiments, delay path(s) 330 may be configured to modify an amount of cell delay and/or wire delay based on path and/or clock control signals 301. In some embodiments, delay path controller 310 may be configured to compare the received output signals 308 to one or more reference signals to determine whether delays in the output signals 308 exceed a threshold delay amount. In some embodiments, delay path controller 310 may be configured to transmit output(s) 116*b* to TAP 110, with output(s) 116*b* indicating whether delays in output signals 308 exceed a threshold delay amount.

It should be appreciated that TAP 110 may be configured to transmit and/or receive different signals and/or a different number than shown in FIG. 2, as embodiments described herein are not so limited.

Figure 3:
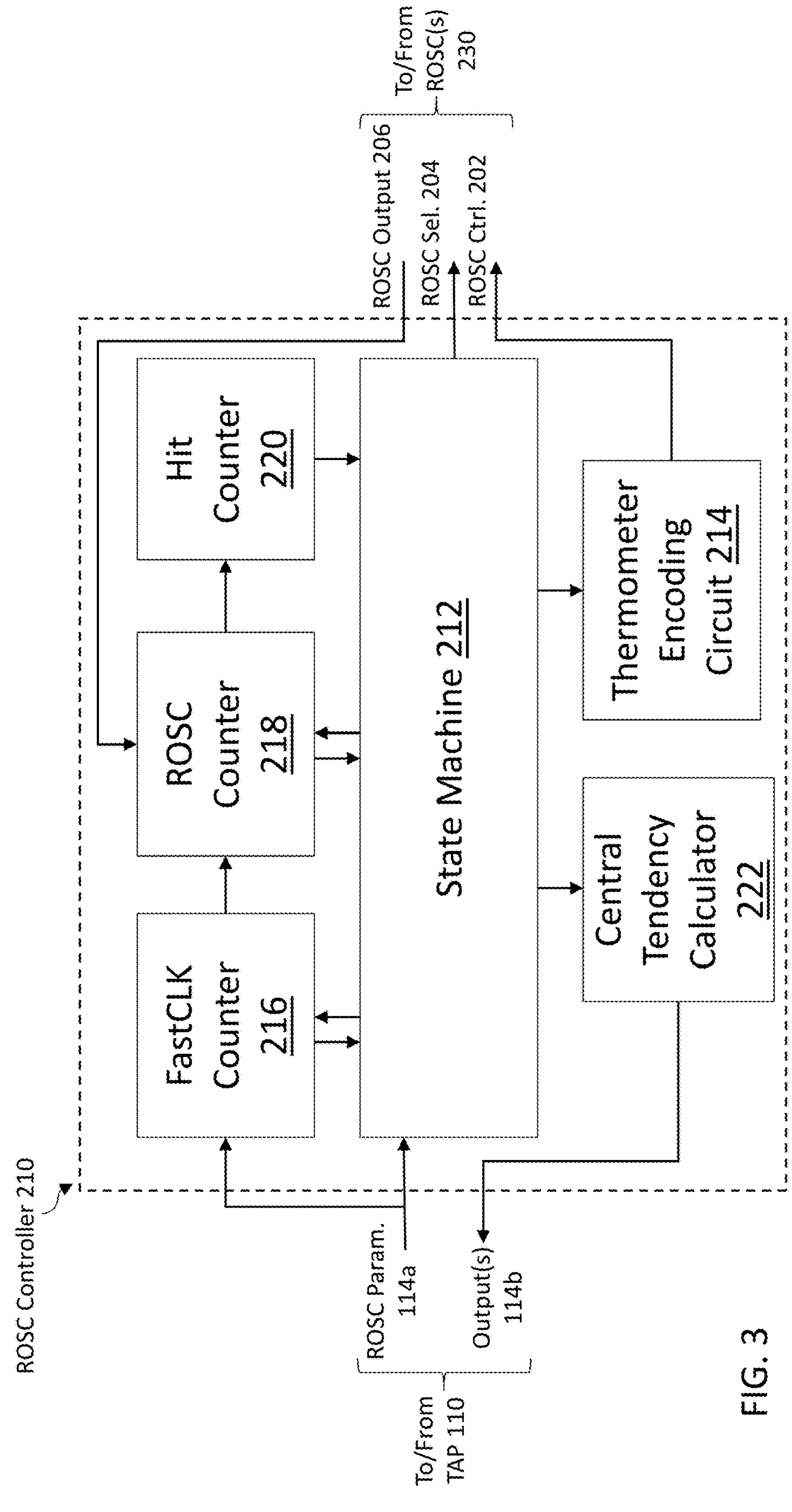
FIG. 3 is a block diagram illustrating an exemplary ROSC controller that may be included in the integrated circuit of FIG. 2, in accordance with some embodiments.

FIG. 3 is a block diagram illustrating an exemplary ROSC controller 210 that may be included in integrated circuit 100*a* or 100*b*, in accordance with some embodiments. As shown in FIG. 3, ROSC controller 210 may include a state machine 212, a thermometer encoding circuit 214, fast clock counter 216, a ROSC counter 218, a hit counter 220, and a central tendency calculator 222. In some embodiments, ROSC controller 210 may be configured to transmit ROSC control signals 202 and ROSC select signals 204 to ROSC(s) 230, receive ROSC output 206 (e.g., one or more oscillator signals) from ROSC(s) 230, and determine a central tendency and/or variance of propagation delay of ROSC(s) 230 using ROSC output 206.

In some embodiments, state machine 212 may be configured to generate and transmit ROSC control signals 202 to ROSC(s) 230 using thermometer encoding circuit 214. For example, in some embodiments, state machine 212 may be configured to transmit signals of ROSC parameter signals 114*a* that are configured to control values of control signals 202 to thermometer encoding circuit 214. In some embodiments, thermometer encoding circuit 214 may be configured to convert the received signals to parallel, thermometer encoded bits suitable for use by ROSC(s) 230. For example, as described further herein, ROSC(s) 230 may have a plurality of ROSC stages each configured to receive a thermometer encoded bit to control a number of ROSC stages that are active during a delay measurement. In some embodiments, state machine 212 may be configured to receive ROSC select signals 204 among ROSC parameter signals 114*a* from TAP 110 and transmit ROSC select signals 204 to ROSC(s) 230. In some embodiments, ROSC(s) 230 may generate and provide ROSC output 206 to ROSC controller 210 in response to receiving ROSC control signals 202.

In some embodiments, state machine 212 may be configured to determine propagation delays of ROSC output 206 by using fast clock counter 216 and ROSC counter 218 to determine a pulse width of ROSC output 206. For example, in some embodiments, fast clock counter 216 may be configured to receive, and increment according to pulses of, a fast clock signal (e.g., included in ROSC parameter signals 114*a* received from TAP 110). In this example, ROSC counter 218 may be configured to receive, and increment according to pulses of, ROSC output 206. Also in this example, state machine 212 may be configured to determine the pulse width of ROSC output 206 by dividing a count of fast clock pulses from fast clock counter 216 by a count of ROSC output 206 pulses from ROSC counter 218.

In some embodiments, state machine 212 may be further configured to determine sampling parameters for determining propagation delays of ROSC output 206 using hit counter 220. In some embodiments, state machine 212 may be configured to determine pre-scaler values for fast clock counter 216 and/or ROSC counter 218 based on a count of pulses of ROSC output 206 stored in hit counter 220. For example, the count stored in hit counter 220 may indicate a number of pulses of ROSC output 206 counted during a measurement cycle, and state machine 212 may be configured to adjust pre-scaler values of fast clock counter 216 and/or ROSC counter 218 if less than a threshold number of pulses are stored in hit counter 220. As described further herein, in some embodiments, fast clock counter 216 and/or ROSC counter 218 may be configured to increment at configurable frequencies with respect to pulses of the fast clock and/or ROSC output 206, where the frequencies can be configured based on pre-scalar values. For example, in some embodiments, if less than a threshold number of pulses are stored in hit counter 220 after a measurement cycle, ROSC controller 210 may be configured to adjust the pre-scalar values to increase the number of counted pulses of ROSC output 206 during the next measurement cycle.

In some embodiments, state machine 212 may be configured to determine a central tendency and/or variance of propagation delay of ROSC(s) 230 using central tendency calculator 222. For example, in some embodiments, state machine 212 may be configured to generate propagation delay measurements for a plurality of stages of ROSC(s) 230 and provide the propagation delay measurements to central tendency calculator 222 to calculate a central tendency of the propagation delay measurements of the plurality of stages, such as a mean, median, or mode of the propagation delay measurements. In some embodiments, state machine 212 may be further configured to provide to central tendency calculator 222 a second set of propagation delay measurements for the plurality of stages, and central tendency calculator 222 may be further configured to calculate a variance of the propagation delay measurements. For example, central delay calculator 222 may be further configured to determine a deviation of each propagation delay measurement from the mean (and/or other central tendency of) propagation delay, and calculate the variance using the mean and deviations. In some embodiments, central tendency calculator 222 may be alternatively or additionally configured to calculate a standard deviation of propagation delay.

Figure 4:
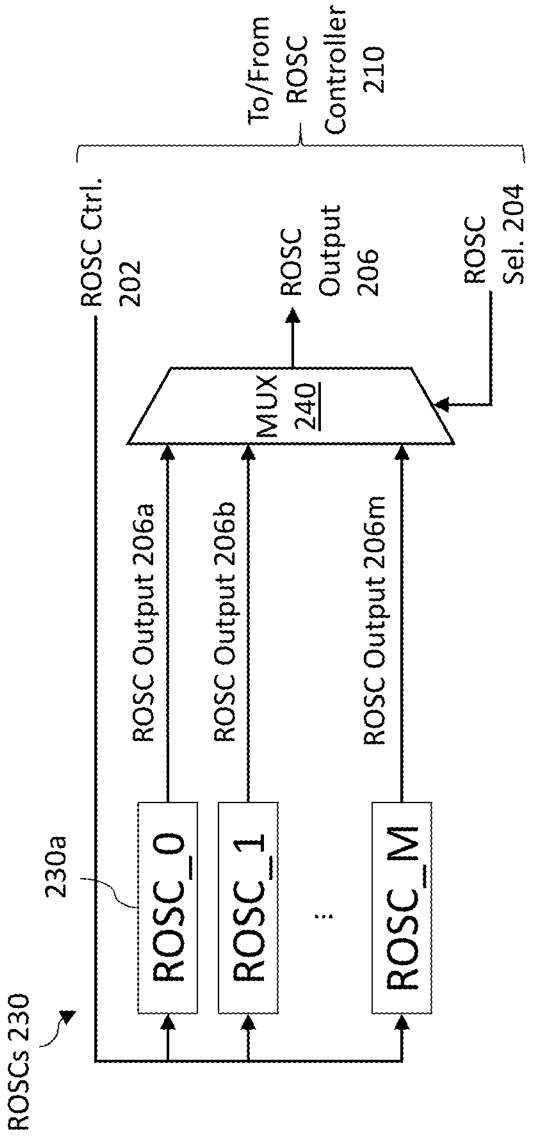
FIG. 4 is a block diagram illustrating a plurality of exemplary programmable ring oscillators (ROSCs) that may be included in the integrated circuit of FIG. 2, in accordance with some embodiments.

FIG. 4 is a block diagram illustrating a plurality of exemplary programmable ROSCs 230 that may be included in integrated circuit 100*a* or 100*b*, in accordance with some embodiments. As shown in FIG. 4, each of ROSCs 230 may be coupled to inputs of a multiplexer (MUX) 240 and configured to receive ROSC control signals 202 from ROSC controller 210. MUX 240 may be configured to receive ROSC outputs 206*a-m* from ROSCs 230 and ROSC select signals 204 from ROSC controller 210 and select among ROSC outputs 206*a-m* to output as ROSC output 206 to ROSC controller 210. In some embodiments, each ROSC 230 may be configured to generate a ROSC output 206*a-m*, which may include oscillator signals generated in response to ROSC control signals 202. In some embodiments, each ROSC 230 may be configured with different physical parameters. For example, in some embodiments, transistors of each ROSC 230 may be configured with different gate voltage thresholds.

Figure 5:
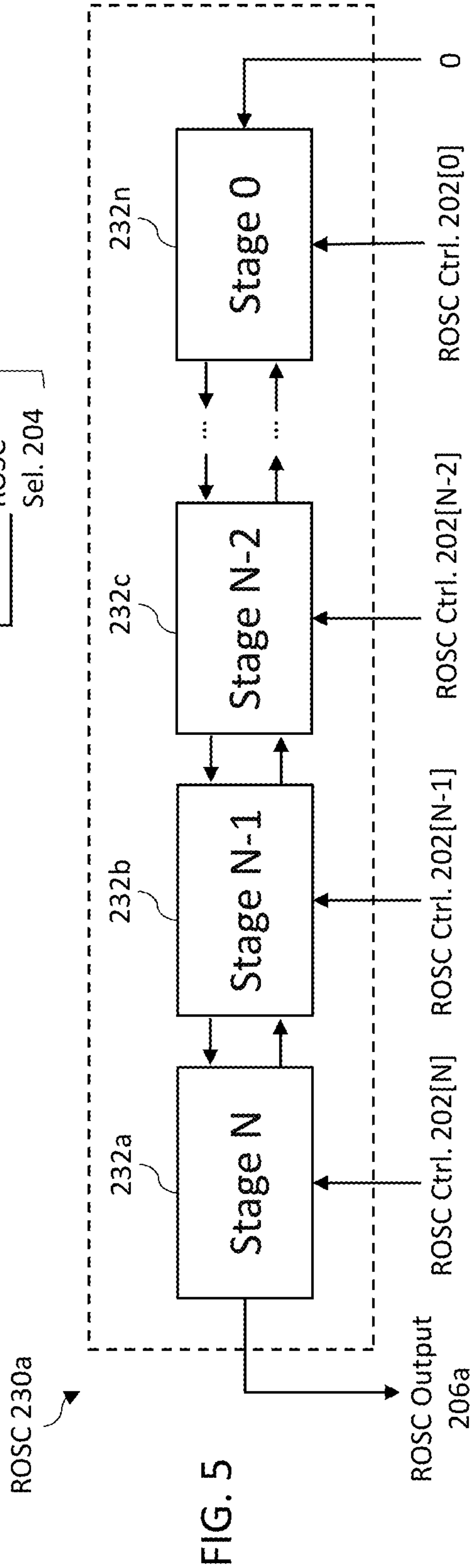
FIG. 5 is a block diagram illustrating one of the programmable ROSCs of FIG. 4, the programmable ROSC including a plurality of ROSC stages, in accordance with some embodiments.

FIG. 5 is a block diagram illustrating programmable ROSC 230*a* of FIG. 4, including a plurality of ROSC stages 232*a-n*, in accordance with some embodiments. In some embodiments, each ROSC 230 of ROSCs 230 shown in FIG. 4 may be configured in the manner described herein for ROSC 230*a*. In some embodiments, ROSC stages 232*a-n* are each coupled to at least one other ROSC stage, and each may be configured to receive a respective control signal of ROSC control signals 202 from controller 210. For example, in FIG. 5, first ROSC stage 232*a* may be configured to receive the Nth control signal (e.g., the Nth bit or group of bits) of ROSC control signals 202, second ROSC stage 232*b* may be configured to receive the N−1th control signal (e.g., the N−1th bit or group of bits) of ROSC control signals 202, and so on. Also shown in FIG. 5, first ROSC stage 232*a* may be configured to generate ROSC output 206*a*, and the last ROSC stage 232*n* may be configured to receive a fixed control signal value, which is a zero value in the example of FIG. 5.

In some embodiments, ROSC stages 232*a-n* may be configured as a programmable delay path, and ROSC 230*a* may be configured to propagate a signal (e.g., an oscillator signal) along the delay path. For example, as shown in FIG. 5, each ROSC stage 232*a-n* may be programmable to transmit and/or receive signals to and/or from at least one other ROSC stage. In some embodiments, ROSC stages 232*a-n* may be switchable into and out of the delay path based on ROSC control signals 202. For example, in some embodiments, when a ROSC stage is switched into the delay path, the ROSC stage may be configured to propagate signals received from at least one ROSC stage to at least one other ROSC stage, and when the ROSC stage is switched out of the delay path, the ROSC stage may be configured to block signals from at least one ROSC stage from reaching at least one other ROSC stage. In this example, switching ROSC stages of ROSC stages 232*a-n* into and out of the delay path may change an amount of propagation delay in signals propagated along the programmable delay path, which may be indicated in ROSC output 206*a* generated at first ROSC stage 232*a*.

In some embodiments, subsequent ones of ROSC stages 232*a-n* (e.g., ROSC stages 232*c-d*) may be programmable into and out of communication with previous ROSC stages (e.g., ROSC stages 232*a-b*). For example, in some embodiments, ROSC control signals 202 may be thermometer encoded. In this example, in some embodiments, a first state of ROSC control signals 202 may include an Nth control signal having a one bit and the remaining ROSC control signals 202 may have zero bits, and a second state of ROSC control signals 202 may include the Nth control signal having a one bit, the N−1th control signal having a one bit, and the remaining ROSC control signals 202 may have zero bits. In the example of FIG. 5, the first state of ROSC control signals 202 may be configured to switch ROSC stage 232*a* into the delay path and all other ROSC stages out of the delay path, and the second state of ROSC control signals 202 may be configured to switch ROSC stages 232*a* and 232*b* into the delay path and all other ROSC stages out of the delay path.

It should be appreciated that a different and/or multiple ROSC stage 232 may be configured to provide ROSC output 206*a* to MUX 240. It should also be appreciated that, in some embodiments, the fixed bit received at ROSC stage 232*n* may include a one, and/or may include a group of bits.

Figure 6:
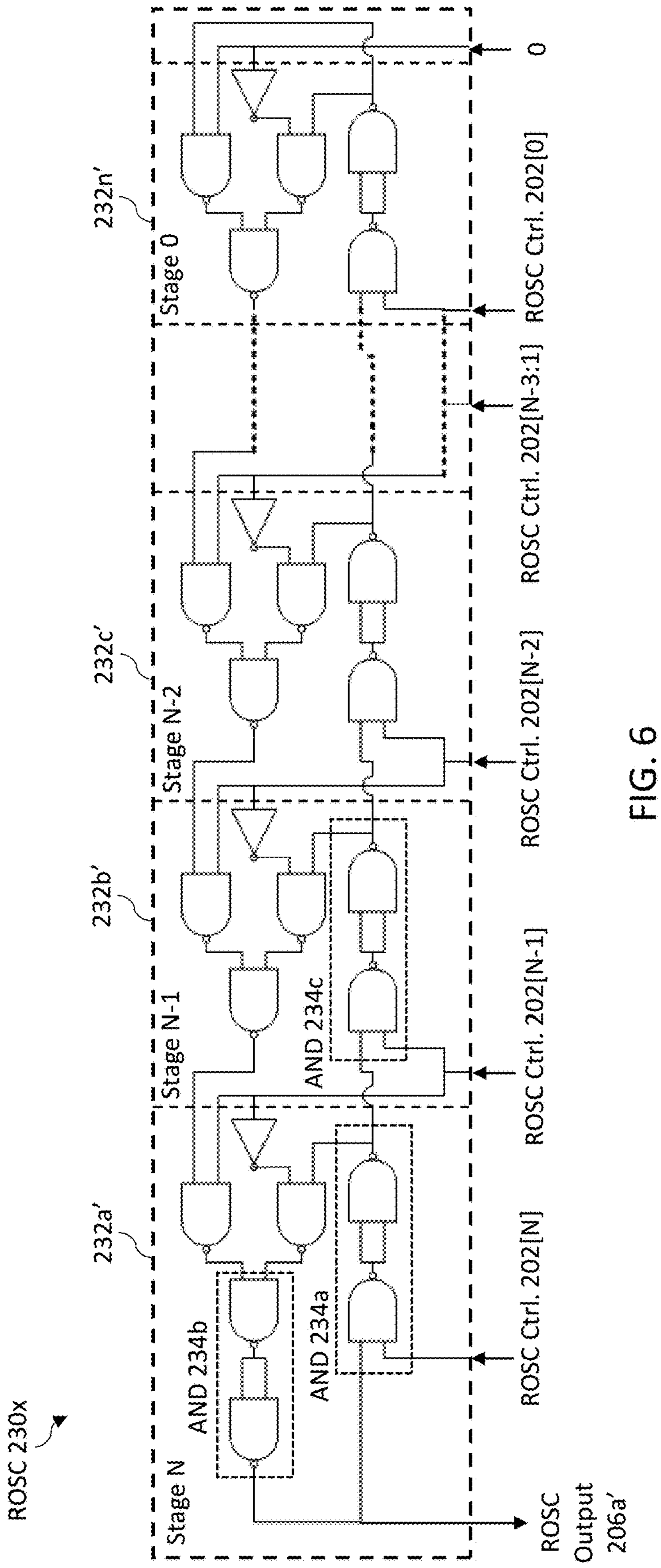
FIG. 6 is a circuit diagram illustrating the programmable ROSC of FIG. 5, in accordance with some embodiments.

FIG. 6 is a circuit diagram illustrating a programmable ROSC 230*x* that may be included in ROSCs 230 of FIG. 4, in accordance with some embodiments. In some embodiments, ROSC 230*x* may be configured in the manner described herein for ROSC 230*a* including in connection with FIG. 5. For example, as shown in FIG. 6, ROSC 230*x* may include ROSC stages 232*a*'-n', with each ROSC stage 232*a*'-n' being coupled to at least one other ROSC stage and configured to receive a respective control signal of ROSC control signals 202. Also shown in FIG. 6, ROSC stage 232*a*' is configured to generate ROSC output 206*a*' (e.g., for transmitting to MUX 240), and ROSC stage 232*n*' is configured to receive a fixed control signal of zero value.

In some embodiments, ROSC stages 232*a*'-n' may be configured as a programmable delay path, and ROSC 230*x* may be configured to propagate an oscillator signal along the delay path. For example, in FIG. 6, ROSC stage 232*a*' includes AND gates 234*a* and 234*b*, with a plurality of logic gates positioned in between, configured to propagate an oscillator signal. In this example, when the Nth control signal of ROSC control signal 202 is a one bit, AND gate 234*a* may be configured to propagate a zero value through the plurality of logic gates to generate one bits at the inputs of AND gate 234*b*, which may then generate a one bit at ROSC output 206*a*' as a rising edge of an oscillator signal at ROSC output 206*a*'. Also in this example, when a one bit appears at ROSC output 206a', the one bits of ROSC output 206a' and the Nth control signal may cause AND gate 234a to propagate a one value through the plurality of logic gates to generate a zero bit at one of the inputs of AND gate 234b, which may then generate a zero bit at ROSC output 206a' as a falling edge of the oscillator signal at ROSC output 206a'. In some embodiments, ROSC stage 232a' may be configured to continue generating rising and falling edges at ROSC output 206a' to generate pulses of the oscillator signal.

In some embodiments, ROSC stages 232a'-n' may be switchable into and out of the delay path based on ROSC control signals 202. For example, in FIG. 6, ROSC stage 232b' includes AND gate 234c and a plurality of logic gates that are programmable based to transmit and receive an oscillator signal to and from ROSC stage 232a'. For example, in FIG. 6, when the N−1th control signal of ROSC control signals 202 is a zero bit, ROSC stage 232b' may be configured to provide the zero bit to ROSC stage 232a', which may block signals propagated by the plurality of logic gates of ROSC stage 232b' from reaching ROSC stage 232a'. For example, the zero bit may keep a one bit as one of the inputs to AND gate 234b, preventing the input of AND gate 234b from changing when signals are propagated by the plurality of logic gates. In this example, ROSC stage 232b' may be switched out of the delay path. Alternatively, when the N−1th control signal of ROSC control signals 202 is a one bit, ROSC stage 232b' may be configured to provide the one bit to ROSC stage 232a', which may allow oscillator signals propagated through AND gate 234c and the plurality of logic gates of ROSC stage 232b' to reach AND gate 234b of ROSC stage 232a', thereby switching ROSC stage 232b' into the delay path. As shown in FIG. 6, subsequent ROSC stages of ROSC 230x may be switchable into and out of the delay path in the manner described herein for ROSC stage 232b'. It should be appreciated that, in FIG. 6, ROSC stage 232a' may also be switchable into and out of the delay path at least in that ROSC stage 232a' may be configured not to produce a falling edge at ROSC output 206a' when the Nth control signal of ROSC control signals 202 is a zero bit.

In the example of FIG. 6, switching ROSC stages of ROSC stages 232a'-n' into and out of the delay path may change an amount of propagation delay in oscillator signals propagated along the programmable delay path, which may be indicated in ROSC output 206a' generated at first ROSC stage 232a'. For example, as described above, when the Nth and N−1th control signals of ROSC control signal 202 are one and zero bits, respectively, rising and falling edges of the oscillator signal may be generated at ROSC output 206a' based on when the oscillator signal propagates through AND gates 234a and 234b and other logic gates of ROSC stage 232a'. Accordingly, propagation delays of AND gates 234a and 234b and other logic gates of ROSC stage 232a' contribute to the time elapsed between the rising and falling edges of the oscillator signal. Also described above, when the Nth and N−1th control signal of ROSC control signals 202 are both one bits, rising and falling edges of the oscillator signal may be generated at ROSC output 206a' based on when the oscillator signal propagates through the AND gates 234a, 234b, and 234c and other logic gates of ROSC stages 232a' and 232b'. Accordingly, propagation delays of AND gates 234a, 234b, and 234c and other logic gates of ROSC stages 232a' and 232b' contribute to the time elapsed between the rising and falling edges of the oscillator signal.

Figure 7:
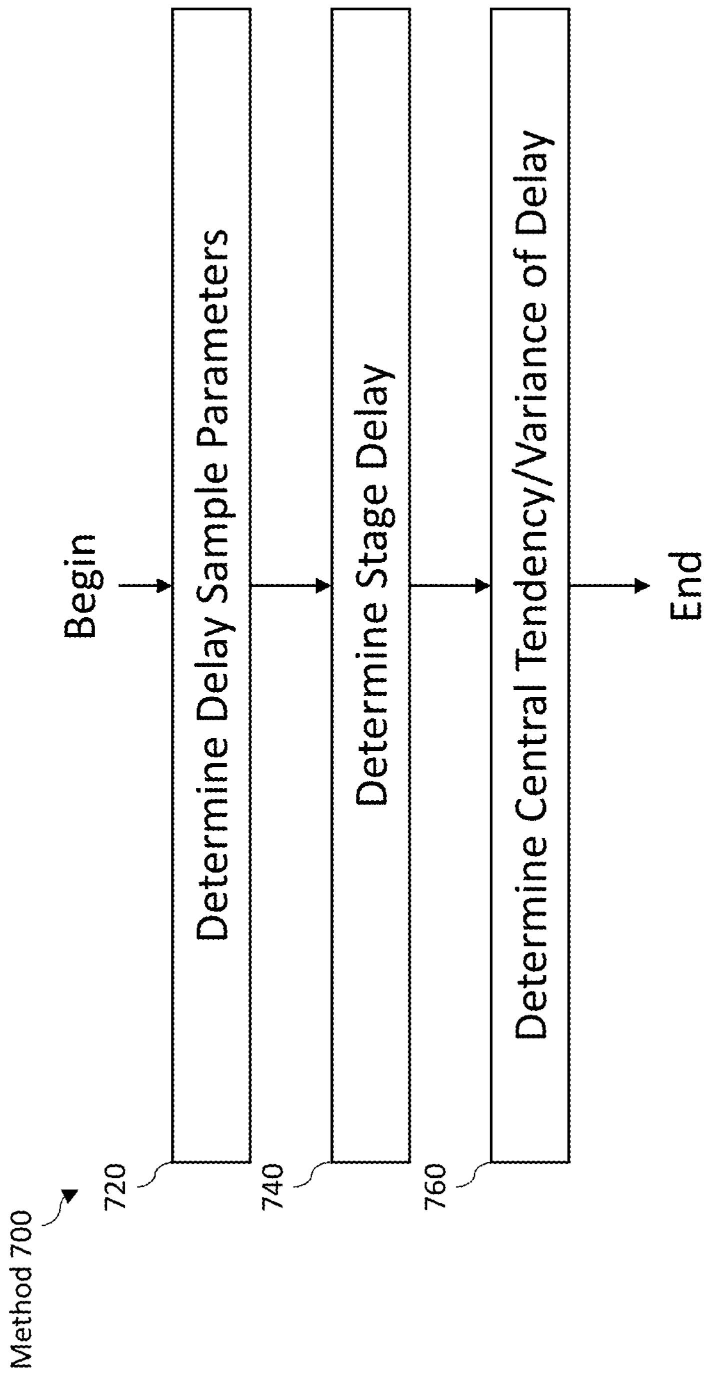
FIG. 7 is a flow diagram illustrating an exemplary method of determining propagation delay of an integrated circuit, in accordance with some embodiments.

FIG. 7 is a flow diagram illustrating an exemplary method 700 of determining propagation delay of an integrated circuit, in accordance with some embodiments. In some embodiments, method 700 may be performed using programmable ROSC circuitry 200a and/or 200b as described herein including in connection with FIGS. 1-5. For example, in some embodiments, method 700 may be performed using a ROSC controller coupled to one or more programmable ROSCs. As shown in FIG. 7, method 700 may include determining delay sample parameters for measuring ROSC pulses at step 720, determining propagation delay of a ROSC stage of one or more ROSCs at step 740, and determining a central tendency and/or variance of propagation delay of the ROSC(s) at step 760.

In some embodiments, determining delay sample parameters at 720 may include determining whether at least a threshold number of ROSC output pulses has been received during a first measurement cycle. For example, in some embodiments, a ROSC controller may transmit ROSC control signals to one or more ROSCs, receive an output from the ROSC(s), and count the number of pulses of the ROSC output over the course of a measurement cycle (e.g., until a fast clock counter of the ROSC controller reaches a predetermined limit. In some embodiments, upon determining that less than the threshold number of ROSC output pulses were counted during the first measurement cycle, method 700 may include adjusting the sample parameters. For example, in some embodiments, the ROSC controller may adjust pre-scalar values of the fast clock counter and/or a ROSC output counter that counts pulses of the ROSC output and run a second measurement cycle. In this example, step 720 of determining delay sample parameters may be repeated for the second measurement cycle. It should be appreciated that some embodiments omit step 720 and proceed to step 740.

In some embodiments, determining propagation delay of a ROSC stage of one or more programmable ROSCs at step 740 may include receiving a ROSC output from the ROSC stage, counting a number of pulses of the ROSC output over a measurement cycle, and counting a number of pulses of a fast clock over the measurement cycle. For example, in some embodiments, a ROSC controller may divide the number of fast clock pulses counted during the measurement cycle by ROSC output pulses counted during the measurement cycle to determine the pulse width of the ROSC output in fast clock pulses. In this example, the frequency of the fast clock may be known, such that the pulse width of the ROSC output in fast clock pulses can be converted to a time in seconds, such as by the ROSC controller and/or by another device communicatively coupled to the ROSC controller. In some embodiments, step 740 may be repeated for multiple ROSC stages or each ROSC stage of a ROSC. In some embodiments, step 720 may be performed for some or each of the ROSC stages before step 740 is performed for the ROSC stage. In some embodiments, the propagation delay determined for a previous ROSC stage may be used to determine the propagation delay of a subsequent ROSC stage. For example, a ROSC having ROSC stages A and B that are switchable into and out of a delay path and configured to receive thermometer encoded control signals, the propagation delay of the delay path including ROSC stage A may be determined first, followed by determining the propagation delay of a delay path including ROSC stages A and B, and subtracting the first propagation delay from the second to obtain the propagation delay of ROSC stage B.

In some embodiments, determining the central tendency and/or variance of propagation delay of the ROSC(s) at step 760 may include calculating the central tendency and/or variance using propagation delays determined at step 740. In some embodiments, step 760 may be performed once step 740 has been performed for multiple ROSC stages of a ROSC. For example, in some embodiments, determining the central tendency of propagation delay of the ROSC(s) may include determining a mean propagation delay of the stages for which step 740 was performed. In some embodiments, step 740 may be performed once (e.g., for each ROSC stage) prior to determining the central tendency of propagation delay and again (e.g., for each ROSC stage) after determining the central tendency of propagation delay. For example, in some embodiments, step 760 may include determining a variance of propagation delay using deviations of propagation delays of each ROSC stage from the central tendency (e.g., mean).

Figure 8:
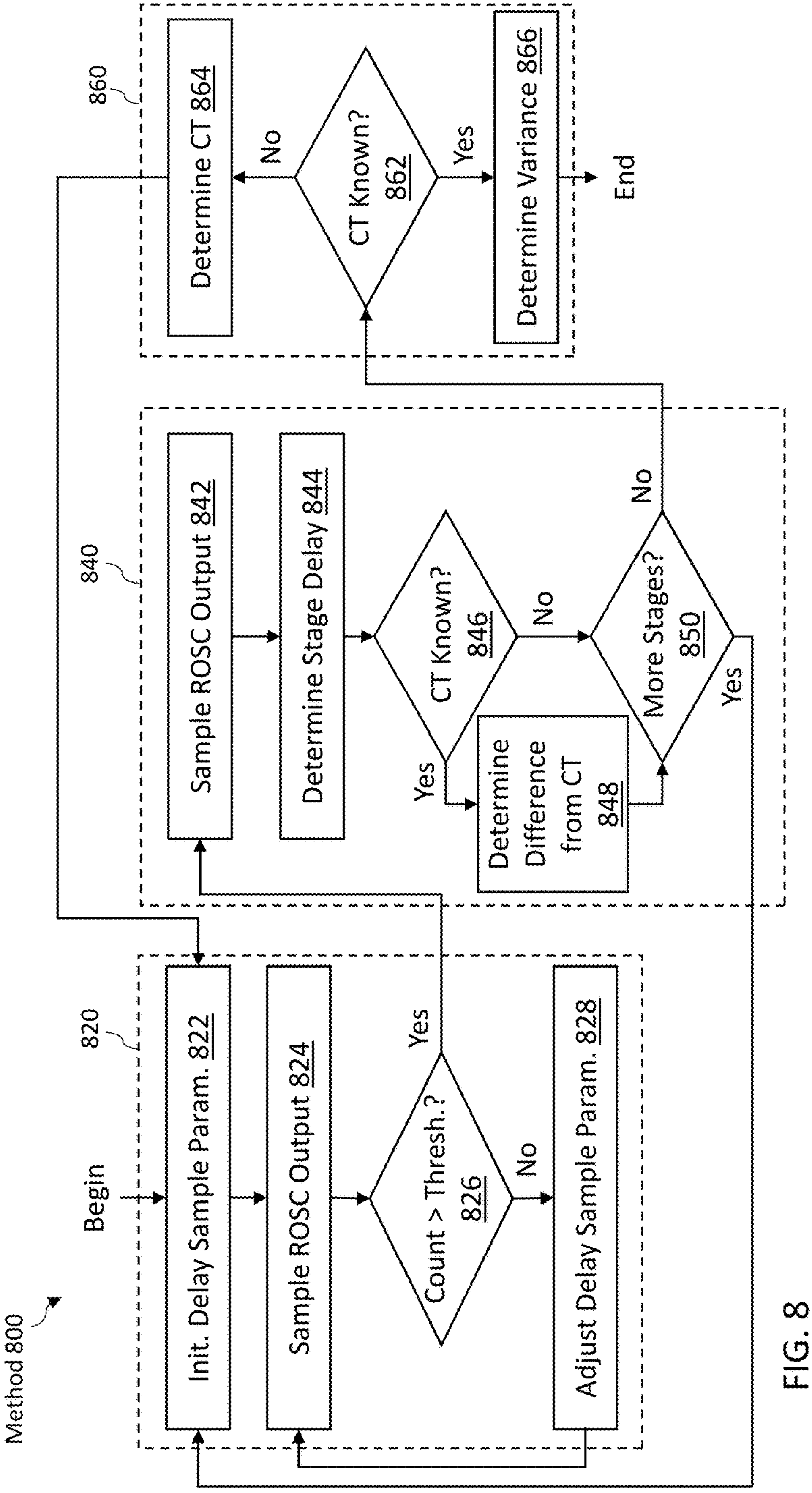
FIG. 8 is a flow diagram illustrating an alternative exemplary method of determining propagation delay of an integrated circuit, in accordance with some embodiments.

FIG. 8 is a flow diagram illustrating an alternative exemplary method 800 of determining propagation delay of an integrated circuit, in accordance with some embodiments. As shown in FIG. 8, method 800 may include determining delay sample parameters for measuring ROSC pulses at step 820, determining propagation delay of a ROSC stage of one or more ROSCs at step 840, and determining a central tendency and/or variance of propagation delay of the ROSC(s) at step 860, which may be performed in the manner described herein for steps 720, 740, and 760 of method 700 in connection with FIG. 7, and as described further below.

As shown in FIG. 8, determining delay sample parameters for measuring ROSC pulses at step 820 may include initializing the delay sample parameters at step 822. In some embodiments, initializing the delay sample parameters at step 822 may include initializing pre-scaler values of a fast clock counter and/or ROSC counter of the ROSC controller. For example, in some embodiments, the pre-scaler values may determine how many pulses of the fast clock pass per increment of the fast clock counter and/or how many pulses of the ROSC output pass per increment of the ROSC counter. In some embodiments, the pre-scaler values may be set such that, initially, a small number of pulses of the fast clock pass per increment of the fast clock counter and a large number of pulses of the ROSC output pass per increment of the ROSC counter. In some embodiments, the pre-scaler values may be set based on input parameters received through a TAP (e.g., TAP 110).

In some embodiments, step 820 may also include sampling the ROSC output from the ROSC(s) at step 824. For example, in some embodiments, sampling the ROSC output may include incrementing the ROSC counter according to pulses of the ROSC output using delay sample parameters (e.g., parameters initialized at step 822 and/or adjusted at step 828). In this example, sampling the ROSC output may be performed for one measurement cycle, such as until the fast clock counter reaches a predetermined count limit and/or the ROSC counter reaches a predetermined count limit.

In some embodiments, step 820 may also include determining whether a count of ROSC output pulses sampled during a measurement cycle is at least equal to a count threshold at step 826. In some embodiments, step 826 may include comparing a value stored in a hit counter of the ROSC controller following a measurement cycle to a count threshold. For example, in some embodiments, the count threshold may be received through a TAP. In some embodiments, in response to determining that the count of ROSC output pulses is not at least equal to the count threshold, step 820 may also include adjusting the delay sample parameters at step 828. For example, in some embodiments, the ROSC controller may change pre-scaler values of the fast clock counter and/or ROSC counter, such as by increasing the number of pulses of the fast clock that pass per increment of the fast clock counter and/or decreasing the number of pulses of the ROSC output that pass per increment of the ROSC counter. The inventors recognized that having at least a threshold count of ROSC output pulses per measurement cycle (e.g., over 1000 pulses in some applications) can ensure that propagation delay calculations rely on a large enough set of delay measurements to yield accurate results. In some embodiments, the ROSC counter pre-scaler values may be adjusted until they reach a minimum before adjusting the fast clock counter pre-scaler values, which may increase the number of ROSC counter pulses counted during a measurement cycle without increasing the duration of the measurement cycle.

In some embodiments, after adjusting the delay sample parameters at step 828, method 800 may return to sampling the ROSC output at step 824 using the adjusted sample delay parameters. In some embodiments, if the count of ROSC output pulses is greater than or equal to the count threshold, method 800 may proceed to determining propagation delay of a ROSC stage at step 840.

As shown in FIG. 8, determining propagation delay of a ROSC stage of one or more ROSCs at step 840 may include sampling the ROSC output at step 842. In some embodiments, sampling the ROSC output at step 842 may include incrementing the ROSC counter according to pulses of the ROSC output using delay sample parameters initialized and/or adjusted during step 820. In this example, sampling the ROSC output may be performed for one measurement cycle, such as until the fast clock counter reaches a predetermined count limit and/or the ROSC counter reaches a predetermined count limit.

In some embodiments, step 840 may also include determining the propagation delay of the ROSC stage at step 844, which may be performed in the manner described herein for step 740 including in connection with FIG. 7. In some embodiments, step 840 may also include determining whether the central tendency of propagation delay of the ROSC(s) has been previously determined at step 846. For example, in some embodiments, step 840 may be performed multiple times for the same or multiple ROSC stages, with a first iteration of step 840 resulting in calculating a central tendency of propagation delay (e.g., at step 864), and a with the second iteration of step 840 resulting in calculating a variance of the propagation delay (e.g., at step 866). In some embodiments, in response to determining that the central tendency of propagation delay has been previously determined, method 800 may proceed to determining the difference between the central tendency of propagation delay and the propagation delay determined for the ROSC stage at step 848. For example, in some embodiments, the difference between the central tendency of propagation delay and the propagation delay determined at step 844 may be used to determine a variance of propagation delay (e.g., at step 866).

In some embodiments, in response to determining that the central tendency of propagation delay has not been previously determined, and/or following step 848, method 800 may proceed to determining whether there are additional ROSC stages for determining propagation delay at step 850. In some embodiments, determining whether there are additional ROSC stages may include determining whether all ROSC stages have been sampled. For example, in some embodiments, in response to determining that one or more ROSC stages have not been sampled, method 800 may return to and/or repeat step 820 and/or step 840 for the ROSC stage(s) that have not been sampled. In this example, steps 820 and/or 840 may be performed for a single ROSC stage at a time. In some embodiments, the determination at step 850 may take into account input parameters received from the TAP indicating which ROSC stages should be sampled. For example, in some embodiments, input parameters received from the TAP may indicate that only one or a subset of ROSC stages should be sampled during performance of method 800. In some embodiments, upon determining that there are no remaining ROSC stages to sample, method 800 may proceed to determining a central tendency and/or variance of propagation delay at step 860.

As shown in FIG. 8, determining a central tendency and/or variance of propagation delay of the ROSC(s) at step 860 may include determining whether the central tendency of propagation delay has been previously determined at step 862. For example, in some embodiments, in response to determining that the central tendency of propagation delay was not previously determined, method 800 may proceed to determining the central tendency of propagation delay at step 864. Alternatively, in some embodiments, in response to determining that the central tendency of propagation delay was previously determined, method 800 may proceed to determining the variance of propagation delay at step 866. In some embodiments, determining the central tendency and/or variance of propagation delay may be performed in the manner described herein for step 760 including in connection with FIG. 7. In some embodiments, after determining the central tendency of delay at step 864, method 800 may return to and/or repeat steps 820, 840, and/or 860. For example, in some embodiments, steps 820 and 860 may be performed (e.g., repeated) for each ROSC stage to be sampled (e.g., sampled in the previous iteration of steps 820, 840, and 860). In some embodiments, method 800 may further include outputting a central tendency and/or variance of propagation delay to the TAP.

Figure 9:
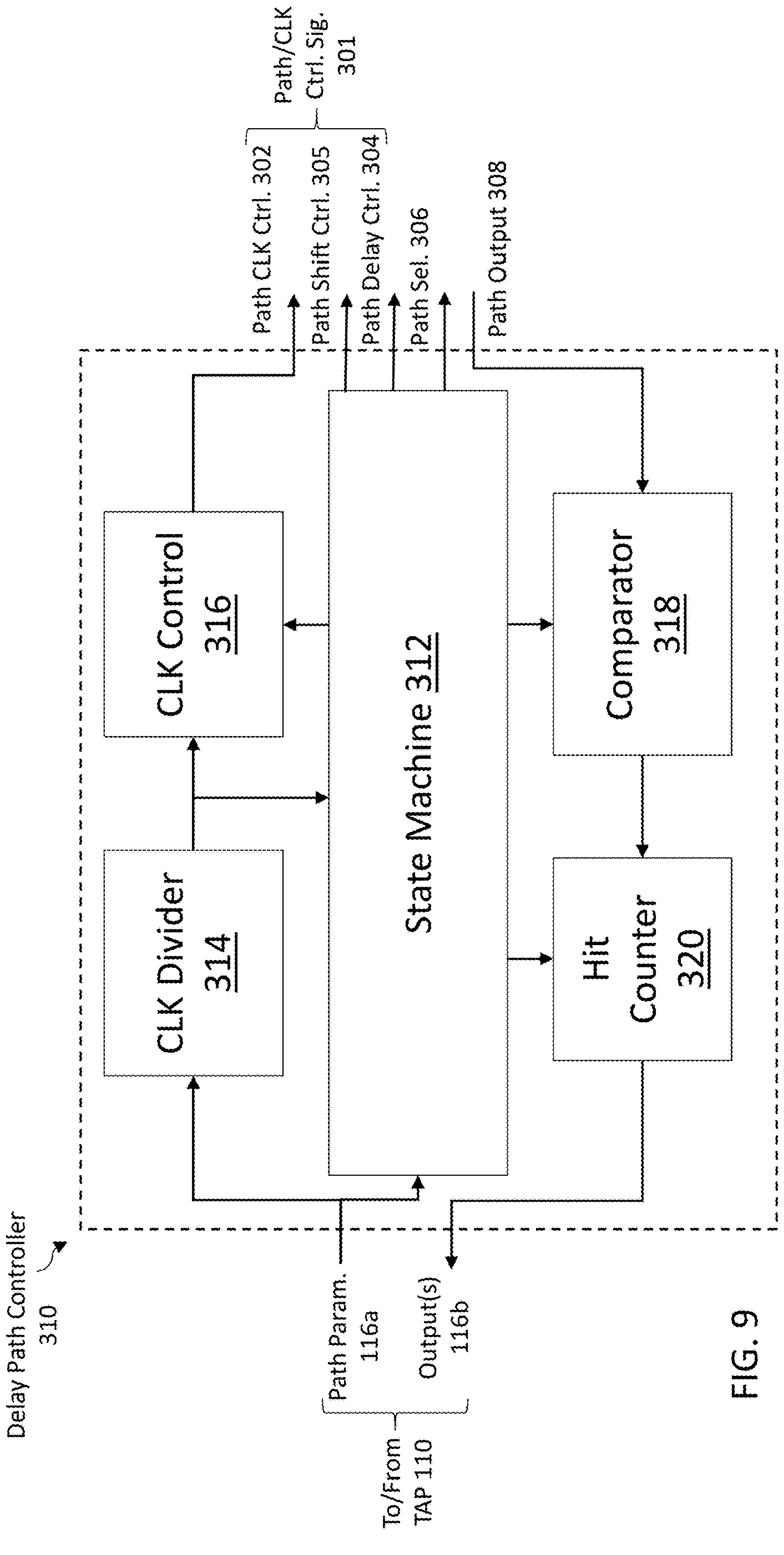
FIG. 9 is a block diagram illustrating an exemplary delay path controller that may be included in the integrated circuit of FIG. 2, in accordance with some embodiments.

FIG. 9 is a block diagram illustrating an exemplary delay path controller 310 that may be included in integrated circuit 100*a* or 100*b*, in accordance with some embodiments. As shown in FIG. 9, delay path controller 310 includes a state machine 312, a clock divider 314, a clock controller 316, a comparator 318, and a hit counter 320. In some embodiments, delay path controller 310 may be configured to generate and/or transmit path and/or clock control signals 301 and path select signals 306 to delay paths 330 based on path parameters 116*a* received from TAP 110. For example, as shown in FIG. 9, path and/or clock control signals 301 can include path clock control signals 302, path delay control signals 304, and path shift control signals 305. In some embodiments, delay path controller 310 may be configured to receive path output 308 from the delay paths 330, compare path output 308 to one or more reference signals, and output results of the comparison(s) to TAP 110 as output(s) 116*b*.

In some embodiments state machine 312 may be configured to transmit path delay control signals 304, path shift control signals 305, and path select control signals 306 to delay paths 330 based on path parameters 116*a* received from TAP 110. For example, in some embodiments, state machine 312 may be configured to transmit path delay control signals 304, path shift control signals 305, and path select control signals 306 to delay paths 330 in the manner the signals are received from TAP 110 in input parameters 116*a*. In some embodiments, state machine 312 may be further configured to generate one or more reference signals for comparator 318 to compare with path output 308. For example, in some embodiments, the reference signal(s) may include delayed clock signals received from clock divider 314 and/or clock controller 316, and/or path shift signals received from TAP 110.

In some embodiments, clock divider 314 and clock controller 316 may be configured to generate and transmit path clock control signals 302 to delay paths 330 based on control signals of path parameters 116*a* received from TAP 110. For example, in some embodiments, clock divider 314 may receive a clock divider control signal among path parameters 116*a* and divide a clock signal based on the clock divider control signal. In some embodiments, clock divider 314 may be configured to provide the divided clock signal to state machine 312 for use in generating reference signals. In some embodiments, clock controller 316 may be configured to output control signals for controlling clock delay tuners of delay paths 330 based on clock delay control signals received among input parameters 116*a*.

In some embodiments, comparator 318 may be configured to receive path output 308 from delay paths 330 and generate an output indicating a comparison between path output 308 and one or more reference signals. For example, in some embodiments, comparator 318 may be further configured to receive the reference signal(s) from state machine 312. In some embodiments, comparator 318 may be configured to determine whether a delay amount of and/or indicated by path output 308 is greater than a threshold delay amount. For example, in some embodiments, comparator 318 may be configured to generate a first output when the delay amount of and/or indicated by path output 308 is greater than the delay amount of and/or indicated by the reference signal(s) and a second output when the delay amount of and/or indicated by path output 308 is less than or equal to the delay amount of and/or indicated by the reference signal(s).

In some embodiments, hit counter 320 may be configured to count a number of measurement cycles during which a delay amount of and/or indicated by path output 308 is less than or equal to (or, alternatively, greater than) a threshold delay amount. For example, in some embodiments, comparator 318 may be configured to output an indication of whether the delay amount of and/or indicated by path output 308 is less than or equal to and/or or greater than the threshold delay amount to hit counter 320, which may be configured to increment for each indication that the threshold delay amount is not (or, alternatively is) exceeded. In some embodiments, hit counter 320 may be configured to output its count to TAP 110 among output(s) 116*b*).

It should be appreciated that, in some embodiments, state machine 312 may be alternatively or additionally configured to provide outputs among output(s) 116*b*.

Figure 10:
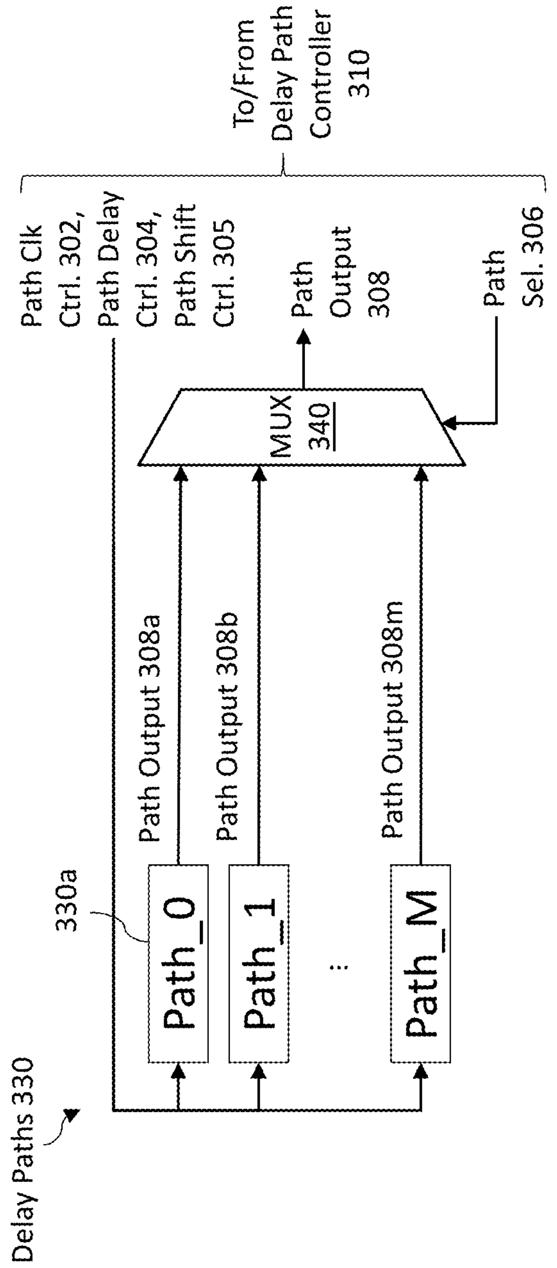
FIG. 10 is a block diagram illustrating a plurality of exemplary programmable delay paths that may be included in the integrated circuit of FIG. 2, in accordance with some embodiments.

FIG. 10 is a block diagram illustrating a plurality of exemplary programmable delay paths 330 that may be included in integrated circuit 100*a* or 100*b*, in accordance with some embodiments. As shown in FIG. 10, each programmable delay path 330 may be configured to receive path clock control signals 302, path delay control signals 304, and path shift control signals 305 from delay path controller 310, and each may be coupled to a MUX 340 to provide path outputs 308*a-m* as inputs to MUX 340. In some embodiments, MUX 340 may be configured to receive path select signals 306 from delay path controller 310 and select from among path outputs 308*a-m* to provide to delay path controller 310 as path output 308. In some embodiments, each programmable delay path 330 may be configured to generate path outputs 308*a*-308*m* based on path clock control signals 302, path delay control signals 304, and path shift control signals 305. For example, in some embodiments, programmable delay paths 330 may be configured to propagate shift control signals using a clock delay based on path clock control signals 302 and cell and/or wire delays based on path delay control signals 304. In some embodiments, each programmable delay path 330 may have transistors with channel widths that are different from channel widths of transistors of the other programmable delay paths 330.

Figure 11:
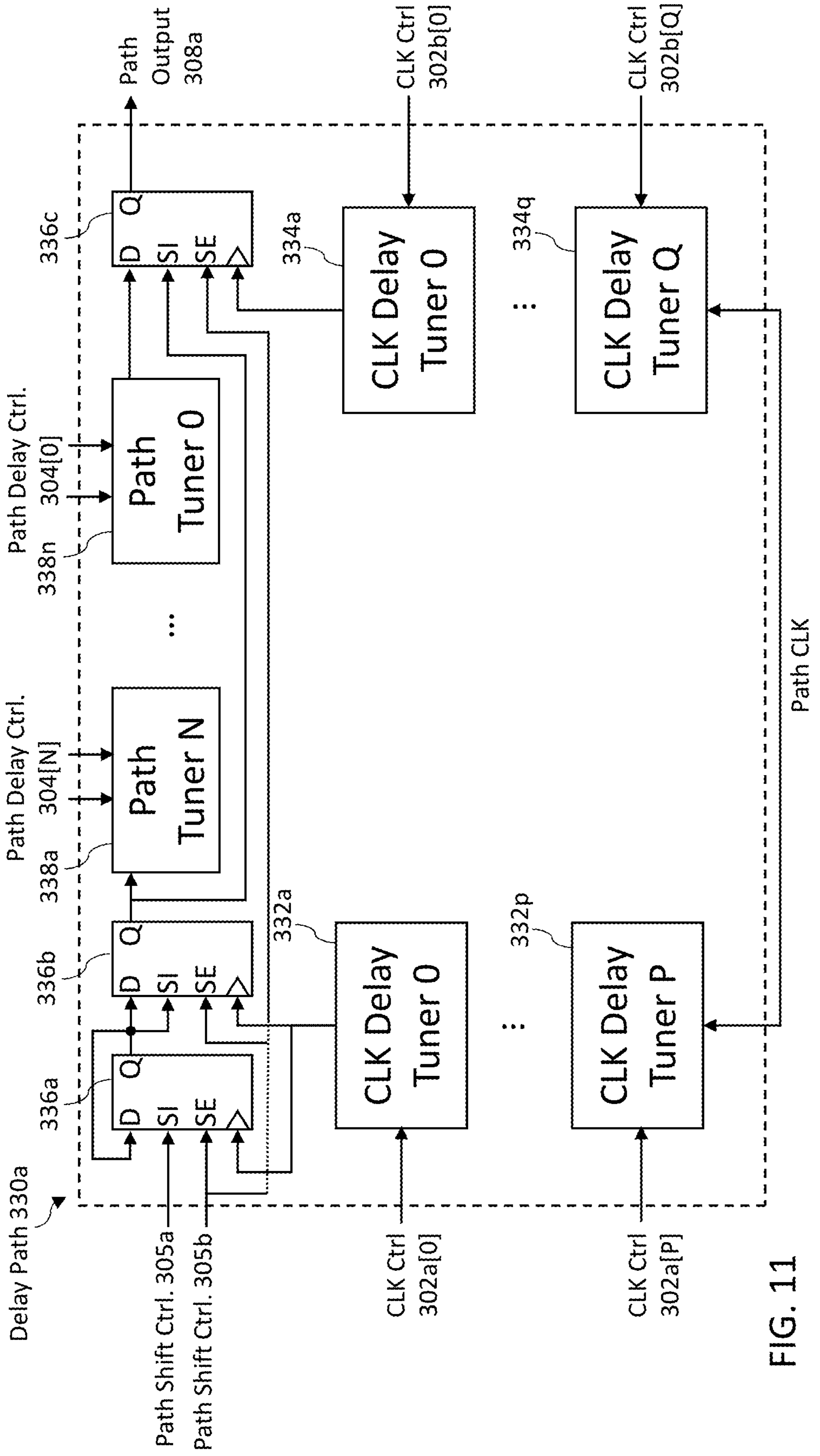
FIG. 11 is a block diagram illustrating one of the programmable delay paths of FIG. 10, the programmable delay path including a plurality of clock delay tuners and path tuners, in accordance with some embodiments.

FIG. 11 is a block diagram illustrating programmable delay path 330*a* of FIG. 10, including input clock delay tuners 332*a-p*, output clock delay tuners 334*a-q* and path tuners 338*a-n*, in accordance with some embodiments. As shown in FIG. 11, delay path 330*a* may also include input flip flops 336*a-b* and output flip flop 336*c*. In some embodiments, input flip flops 336*a-b* may be configured to receive clock signals from input clock delay tuners 332*a-p* and path shift control signals 305*a* and 305*b* from delay path controller 310 and provide the path shift control signals 305*a* and 305*b* to path tuners 338*a-n* and output flip flop 336*c* based on the clock signals. In some embodiments, output flip flop 336*c* may be further configured to receive clock signals from output clock delay tuners 334*a-q*.

In some embodiments, delay path 330*a* may be configured to generate path output 308*a* based on clock control signals 302*a* and clock control signals 302*b*. For example, in some embodiments, input clock delay tuners 332*a*-332*p* may be configured to receive respective control signals (e.g., bits or groups of bits) of clock control signals 302*a* and control a delay between when path shift control signals 305*a* are received at input flip flops 336*a-b* and when path shift control signals 305*a* reach output flip flop 336*c* via path tuners 338*a-n* based on clock control signals 302*a*. In this example, input clock delay tuners 332*a*-332*p* may be configured to add a delay to clock signals (e.g., received from path delay controller 310) provided to input flip flops 336*a-b*. Alternatively or additionally, in some embodiments, output clock delay tuners 334*a-q* may be configured to receive respective control signals (e.g., bits or groups of bits) of clock control signals 302*b* and control a delay between when path shift control signals 305*a* are received at output flip flop 336*c* and when output flip flop 336*c* generates path output 308*a*. For example, in some embodiments, output clock delay tuners 334*a-q* may be configured to add a delay to clock signals (e.g., the same clock signals provided to input clock delay tuners 332*a-p*) provided to output flip flop 336*c*.

In some embodiments, delay path 330*a* may be further configured to generate path output 308*a* based on the received path shift signals and path delay control signals 304. For example, in some embodiments, path tuners 338*a-n* may be configured to receive respective control signals (e.g., bits or groups of bits) of path delay control signals 304 and add an amount of cell delay and/or wire delay based on path delay control signals 304. In some embodiments, path tuners 338*a-n* may be configured to add programmable proportions of cell delay and/or wire delay to the path shift signals. Alternatively or additionally, in some embodiments, path tuners 338*a-n* may be configured to output versions of the path shift signals propagated using transistors having different voltage thresholds based on path delay control signals 304. In some embodiments, each path tuner 338*a-n* may be individually programmable (e.g., via respective control signals of path delay control signals 304) to provide add different amounts of cell delay and/or wire delay and/or to output path shift signals propagated using transistors having different voltage thresholds.

Figure 12:
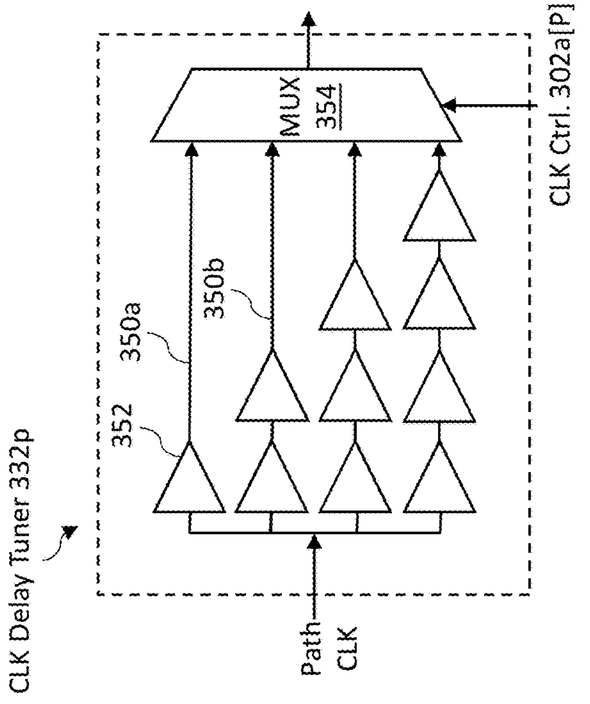
FIG. 12 is a block diagram illustrating one of the clock delay tuners of FIG. 11, in accordance with some embodiments.

FIG. 12 is a block diagram illustrating input clock delay tuner 332*a* of FIG. 11, in accordance with some embodiments. In some embodiments, each input clock delay tuner 332*a-p* and/or output clock delay tuner 334*a-q* may be configured in the manner described herein for input clock delay tuner 332*a*.

In some embodiments, input clock delay tuner 332*a* may be configured to propagate a path clock signal (e.g., from delay path controller 310) along one or more sub-paths to add delay to the path clock signal. As shown in FIG. 12, clock delay tuner 332*a* may include a plurality of sub-paths 350, including sub-paths 350*a-b*, each sub-path 350 including one or more logic gates 352, and each sub-path 350 configured to receive the path clock signal. In some embodiments, each sub-path 350 may be configured to add a different amount of cell delay to the path clock signal than the other sub-paths 350. For example, in some embodiments, each sub-path 350 may have a different number of logic gates 352 than the other sub-paths 350.

In some embodiments, clock delay tuner 332*a* may be further configured to output a version of the path clock signal having an amount of delay based on clock control signals 302. As shown in FIG. 12, clock delay tuner 332*a* may include a MUX 354 configured to receive signals from each sub-path 350 and a respective control signal of path clock control signals 302 (e.g., the Pth group of bits of path clock control signal 302*a*). For example, in some embodiments, MUX 354 may be configured to output one of the signals received from sub-paths 350 based on the respective path clock control signal received from delay path controller 310.

Figure 13:
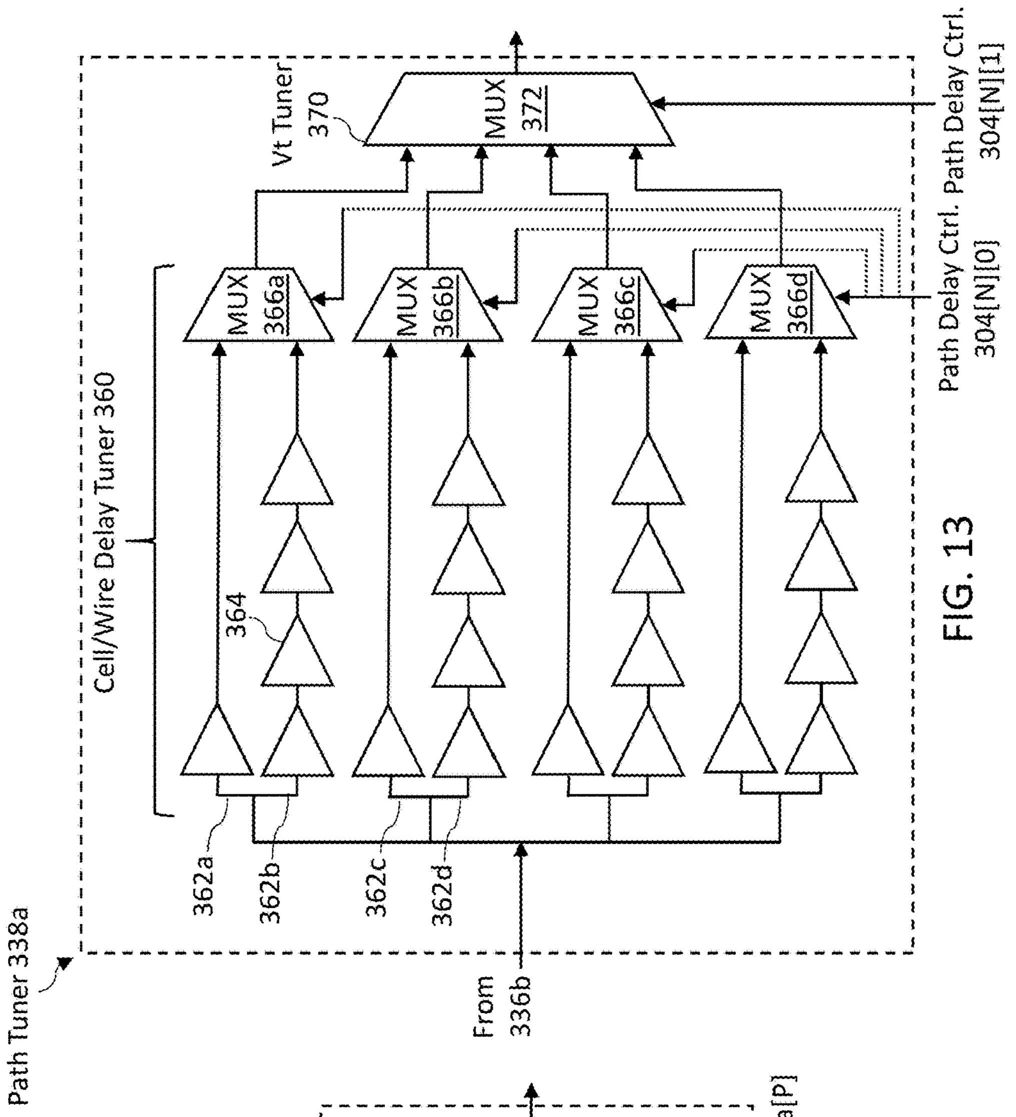
FIG. 13 is a block diagram illustrating one of the path tuners of FIG. 11, in accordance with some embodiments.

FIG. 13 is a block diagram illustrating path tuner 338*a* of FIG. 11, in accordance with some embodiments. In some embodiments, each path tuner 338*a-n* may be configured in the manner described herein for path tuner 338*a*. In some embodiments, path tuner 338*a* may be configured to propagate a path shift signal from input flip flop 336*a* and/or 336*b* along one or more sub-paths, adding programmable amounts of cell and/or wire delay to the path shift signal and using logic gates having transistors with a selected voltage threshold. As shown in FIG. 13, path tuner 338*a* may include cell and/or wire delay tuner 360 and voltage threshold tuner 370. In some embodiments, cell and/or wire delay tuner 360 may be configured to receive a first portion and voltage threshold tuner 370 may be configured to receive a second portion of the respective (e.g., Nth) control signal of path delay control signals 304.

Cell and/or wire delay tuner 360 may be configured to add programmable amounts of cell and/or wire delay to the received path shift signal based on path delay control signals 304. As shown in FIG. 13, cell and/or wire delay tuner 360 may include a plurality of sub-paths 362, including sub-paths 362*a-d*, each sub-path 362 including one or more logic gates 364 (e.g., inverters), and each sub-path 362 configured to receive the path shift signal. In some embodiments, some sub-paths 362 may be configured to add different amounts of cell and/or wire delays to the path shift signal than other sub-paths 362. For example, as shown in FIG. 13, sub-paths 362*a* and 362*b* may have different numbers of logic gates 362. In this example, a sub-path with fewer logic gates may add more wire delay than cell delay to the path shift signal, and a sub-path with more logic gates may add more cell delay than wire delay to the path shift signal. Also shown in FIG. 13, cell and/or wire delay tuner 360 may include multiplexers (MUXes) 366*a-d*, which may be each configured to receive path shift signals from respective pairs of the sub-paths 362 and output one of the path shift signals based on path delay control signals 304.

In some embodiments, voltage threshold tuner 370 may be configured to selectively output path shift signals from cell and/or wire delay tuner 360 propagated by logic gates having transistors with different voltage thresholds based on path delay control signals 304. For example, in some embodiments, logic gates 364 of sub-paths 362*a-b* may have transistors with a first voltage threshold and logic gates 364 of sub-paths 362*c-d* may have transistors with a second voltage threshold different from the first voltage threshold.

Figure 14:
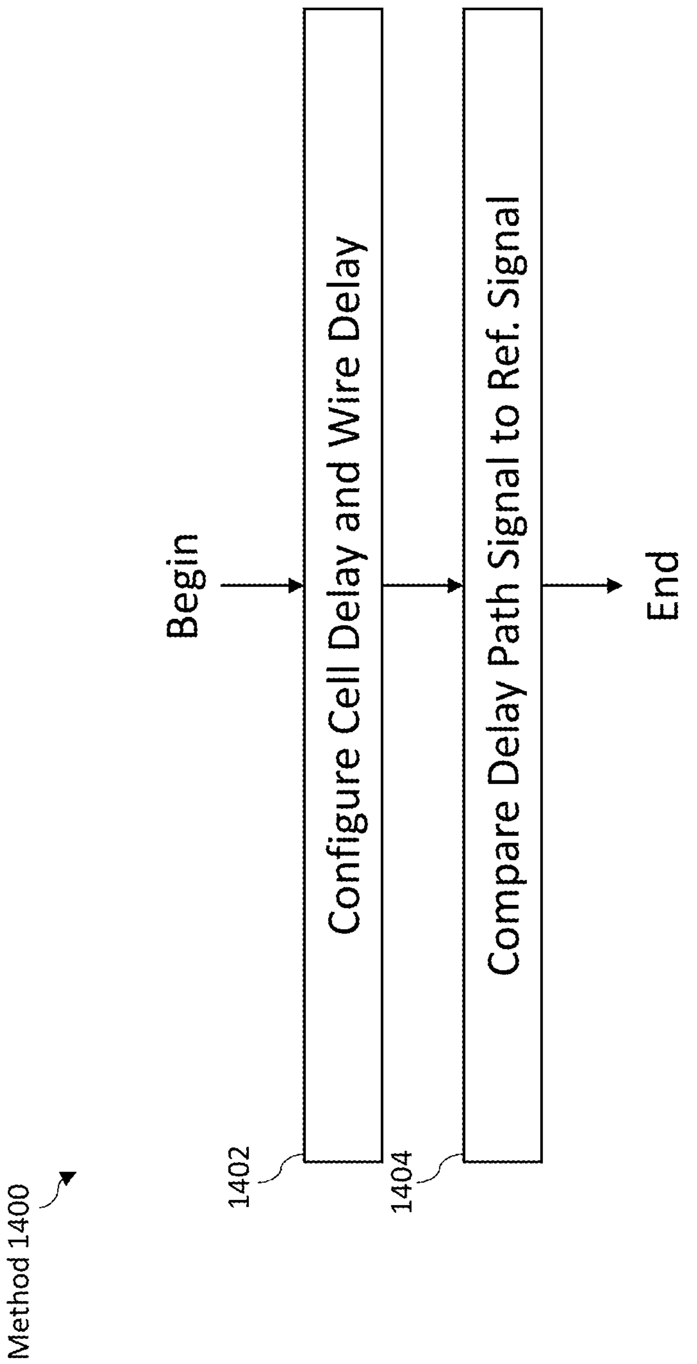
FIG. 14 is a flow diagram of an exemplary method of determining path delay of an integrated circuit, in accordance with some embodiments.

FIG. 14 is a flow diagram of an exemplary method 1400 of determining path delay of an integrated circuit, in accordance with some embodiments. In some embodiments, method 1400 may be performed using programmable delay path circuitry 300*a* and/or 300*b* as described herein including in connection with FIGS. 1-2 and 9-13. For example, in some embodiments, method 1400 may be performed using a path delay controller coupled to one or more programmable delay paths. As shown in FIG. 14, method 1400 may include configuring cell delay and wire delay of one or more programmable delay paths at step 1402 and comparing one or more delay path signals to one or more reference signals at step 1404.

In some embodiments, configuring cell delay and wire delay of the programmable delay path(s) at step 1402 may include a delay path controller transmitting a plurality of control signals to the programmable delay path(s). For example, in some embodiments, the plurality of control signals may include clock delay control signals, path delay control signals, and/or path shift control signals. In some embodiments, the delay path controller may receive and/or generate the control signals in response to path parameters received via a TAP. In some embodiments, the programmable delay path may generate the delay path signal(s) based on the received control signals. For example, in some embodiments, the programmable delay path may add an amount of cell delay and/or an amount of wire delay to the path based on the received control signals. In some embodiments, the plurality of control signals may include path select signals for selecting a delay path signal from among a plurality of delay path outputs from a plurality of programmable delay paths. In some embodiments, the delay path controller may receive the delay path signal(s) from the programmable delay paths for comparison to the reference signal(s) at step 1404.

In some embodiments, comparing the delay path signal(s) to the reference signal(s) may include the delay path controller generating a reference clock signal and/or a reference path shift signal and comparing the delay path signal(s) to the reference clock and/or path shift signal. For example, in some embodiments, comparing the delay path signal(s) to the reference clock and/or path shift signal may generate an output indicating an amount of delay in the delay path signal(s). In this example, the output may indicate whether the amount of delay in the delay path signal(s) is less than or equal to (or, alternatively, greater than) a threshold delay amount. In some embodiments, steps 1702 and 1704 may be repeated for a plurality of measurement cycles and a hit counter of the delay path controller may count a number of measurement cycles in which the amount of delay in the delay path was less than or equal to (or, alternatively, greater than) the threshold delay amount. In some embodiments, the delay path controller may output the number from the hit counter via a TAP.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as “first”, “second”, “third”, etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of “including”, “comprising”, “having”, “containing” or “involving” and variations thereof herein, is meant to encompass the items listed thereafter and equivalents thereof as well as additional items.

The use of “coupled” or “connected” is meant to refer to circuit elements, or signals, that are either directly linked to one another or through intermediate components.

The terms “approximately”, “substantially,” and “about” may be used to mean within ±20% of a target value in some embodiments, within ±10% of a target value in some embodiments, within ±5% of a target value in some embodiments, and within ±2% of a target value in some embodiments. The terms “approximately” and “about” may include the target value.

What is claimed is:

1. An integrated circuit, comprising:

programmable circuitry configured to generate a first oscillator signal in response to a first plurality of control signals and a second oscillator signal in response to a second plurality of control signals having values different from the first plurality of control signals; and a controller configured to provide the first and second pluralities of control signals to the programmable circuitry, receive the first and second oscillator signals, and determine a central tendency of propagation delay of the programmable circuitry using the first and second oscillator signals.

2. The integrated circuit of claim 1, wherein the controller is configured to determine first and second pulse widths of the first and second oscillator signals, respectively, and determine the central tendency of propagation delay of the programmable circuitry using the first and second pulse widths.

3. The integrated circuit of claim 1, wherein the controller is further configured to determine sampling parameters for determining the central tendency of propagation delay using the first and/or second oscillator signals.

4. The integrated circuit of claim 1, wherein the central tendency of propagation delay is a mean propagation delay of the programmable circuitry, and wherein the controller is further configured to determine a variance of propagation delay of the programmable circuitry.

5. The integrated circuit of claim 1, wherein the programmable circuitry comprises a programmable ring oscillator that has a plurality of selectable oscillator stages and is configured to:

select a first subset of the plurality of selectable oscillator stages based on the first plurality of control signals to generate the first oscillator signal; and select a second subset of the plurality of selectable oscillator stages based on the second plurality of control signals to generate the second oscillator signal.

6. The integrated circuit of claim 5, wherein:

the programmable circuitry further comprises a second programmable ring oscillator that has a second plurality of selectable oscillator stages and is configured to:

select a first subset of the second plurality of selectable oscillator stages based on the first plurality of control signals to generate a third oscillator signal; and select a second subset of the second plurality of selectable oscillator stages based on the second plurality of control signals to generate a fourth oscillator signal;

the programmable ring oscillator comprises a first plurality of transistors and the second programmable ring oscillator comprises a second plurality of transistors having different control terminal threshold voltages than the first plurality of transistors; and the controller is further configured to receive the third and fourth oscillator signals and determine a central tendency of propagation delay of the second programmable ring oscillator using the third and fourth oscillator signals.

7. An integrated circuit, comprising:

programmable circuitry configured to generate a first oscillator signal in response to a first plurality of control signals and a second oscillator signal in response to a second plurality of control signals; and a controller configured to provide the first and second pluralities of control signals to the programmable circuitry, receive the first and second oscillator signals, and determine a central tendency of propagation delay of the programmable circuitry using the first and second oscillator signals, wherein:

the controller is configured to determine first and second pulse widths of the first and second oscillator signals, respectively, and determine the central tendency of propagation delay of the programmable circuitry using the first and second pulse widths; and the controller is configured to subtract one of the first and second pulse widths from the other of the first and second pulse widths to generate a third pulse width and determine the central tendency of propagation delay using the third pulse width and the other of the first and second pulse widths.

8. An integrated circuit, comprising:

a programmable ring oscillator comprising a delay path, the programmable ring oscillator being configured to propagate an oscillator signal along the delay path, wherein the delay path comprises a plurality of oscillator stages, oscillator stages of the plurality of oscillator stages being switchable into and out of the delay path based on a plurality of respective control signals; and a second programmable ring oscillator comprising a second delay path, the second programmable ring oscillator being configured to propagate a second oscillator signal along the second delay path, wherein the second delay path comprises a second plurality of oscillator stages, oscillator stages of the second plurality of oscillator stages being switchable into and out of the second delay path based on a second plurality of respective control signals, and wherein the programmable ring oscillator comprises a first plurality of transistors, the second programmable ring oscillators comprises a second plurality of transistors, and the first plurality of transistors have different control terminal voltage thresholds than the second plurality of transistors.

9. The integrated circuit of claim 8, further comprising a controller configured to:

provide the plurality of control signals to the programmable ring oscillator and the second plurality of control signals to the second programmable ring oscillator;

receive the oscillator signal from the programmable ring oscillator and the second oscillator signal from the second programmable ring oscillator; and determine pulse widths of the oscillator signal and the second oscillator signal.

* * * * *